(12) United States Patent
Benjamin

(10) Patent No.: US 10,035,654 B2
(45) Date of Patent: Jul. 31, 2018

(54) TRANSFER CHUTE

(71) Applicants: GULF CONVEYOR SYSTEMS PTY LTD, New South Wales (AU); NARBEL PTY LTD, New South Wales (AU)

(72) Inventor: Colin William Benjamin, New South Wales (AU)

(73) Assignees: GULF CONVEYOR SYSTEMS PTY LTD. (AU); NARBEL PTY LTD (AU)

( * ) Notice: Subject to any disclaimer, the term of this patent is extended or adjusted under 35 U.S.C. 154(b) by 0 days.

(21) Appl. No.: 14/421,127

(22) PCT Filed: Aug. 19, 2013

(86) PCT No.: PCT/AU2013/000918
§ 371 (c)(1),
(2) Date: Feb. 11, 2015

(87) PCT Pub. No.: WO2014/026248
PCT Pub. Date: Feb. 20, 2014

(65) Prior Publication Data
US 2015/0191310 A1 Jul. 9, 2015

(30) Foreign Application Priority Data
Aug. 17, 2012 (AU) ................................ 2012903566

(51) Int. Cl.
*B65G 11/16* (2006.01)
*B65G 47/18* (2006.01)
(Continued)

(52) U.S. Cl.
CPC .......... *B65G 11/166* (2013.01); *B65G 11/026* (2013.01); *B65G 11/206* (2013.01);
(Continued)

(58) Field of Classification Search
CPC ... B65G 11/083; B65G 11/166; B65G 11/206; B65G 11/026; B65G 11/16; B65G 47/18; B65G 47/19
(Continued)

(56) References Cited

U.S. PATENT DOCUMENTS 4,176,997 A 12/1979 Hungerbach
5,513,581 A 5/1996 Lonardi et al.
(Continued)

*Primary Examiner* — Leslie A Nicholson, III
*Assistant Examiner* — Keith R Campbell
(74) *Attorney, Agent, or Firm* — Tarolli, Sundheim, Covell & Tummino LLP

(57) ABSTRACT

A transfer chute (10) for use in bulk materials handling operations, and also a methodology for designing such a transfer chute, a method of constructing the transfer chute, and a method of transferring bulk materials between two locations using the transfer chute. The transfer chute (10) comprises a chute body (11) defining a flow pathway (19), with an upper section (19a) of the flow pathway accommodating accelerating flow to maintain dense granular flow regime, an intermediate section (19b) of the flow pathway providing consolidated flow in which the flow rate is retarded in a controlled manner avoiding creation of flow turbulence, and a lower section (19c) of the flow pathway in which flow is further retarded to create a controlled accumulation and build-up of material upwardly from the lower section.

46 Claims, 10 Drawing Sheets

(51) Int. Cl.
   *B65G 47/19* (2006.01)
   *B65G 11/20* (2006.01)
   *B65G 11/02* (2006.01)
   *G06F 17/50* (2006.01)

(52) U.S. Cl.
   CPC .............. *B65G 47/18* (2013.01); *B65G 47/19* (2013.01); *G06F 17/50* (2013.01)

(58) Field of Classification Search
   USPC .................................................. 193/32, 2 R
   See application file for complete search history.

(56) References Cited

U.S. PATENT DOCUMENTS

| | | | | |
|---|---|---|---|---|
| 6,041,906 | A * | 3/2000 | Howard | B65G 11/166 193/2 R |
| 6,250,450 | B1 * | 6/2001 | Howard | B65G 11/166 193/2 R |
| 6,684,999 | B1 * | 2/2004 | Howard | B65G 11/166 193/2 R |
| 2004/0182673 | A1 * | 9/2004 | Baller | B65G 11/083 193/32 |
| 2016/0010921 | A1 * | 1/2016 | Boeberl | C22B 1/26 432/77 |

* cited by examiner

TRANSFER CHUTE

TECHNICAL FIELD

This invention relates to a transfer chute for use in bulk materials handling operations. In particular, the invention relates to a methodology for designing a transfer chute, a method of constructing a transfer chute, a transfer chute itself and a method of transferring bulk materials between two locations.

BACKGROUND ART

The following discussion of the background art is intended to facilitate an understanding of the present invention only. The discussion is not an acknowledgement or admission that any of the material referred to is or was part of the common general knowledge as at the priority date of the application.

A transfer chute can be described as any static interface between two conveyor belts or between a piece of operating equipment (such as a screen or crusher) and a conveyor belt. Transfer chutes are an integral part of a conveyor system and such systems are commonly used and relied upon in the bulk materials handling industry.

Transfer chutes, particularly in industries that are handling abrasive ores or ores that could be described as complex due to their variability in size, moisture content and material shape, are a major burden to maintenance. They can also be a major constraint to production if they do not have the capacity of the conveyor system in which they operate and through the maintenance needs that require scheduled and un-scheduled maintenance.

Accordingly, there is a need for a transfer chute for which maintenance requirements and consequences are minimised or at least reduced. Indeed, issues associates with transfers chutes are considered to be a major constraint to production in bulk materials handling industry.

The design of transfer chutes is a fundamental issue in meeting such a need.

It is now accepted that the key design criterion has always been:
  (a) The transfer chute must be able to handle the capacity of the conveyor or component that feeds bulk material into it; in other words it should not be a constraint to the system capacity.
  (b) The transfer chute should not through its design create uncontrolled build-up of material that could create a flow constraint or blockage.
  (c) The transfer chute should present the bulk material flow onto the receiving conveyor belt (or receiving component) with the minimum of dust and spillage and in a manner that does not in itself cause problems with the operation of the rest of the system, for instance by causing the receiving conveyor belt to track off.
  (d) The transfer chute should preferably be of a design that minimised the need for maintenance as maintenance downtime will limit plant capacity over time.
  (e) Maintenance functions on the transfer chute, where necessary, should preferably be facilitated.

These design ideals have been long recognised as the guiding principles in the design of any transfer chute. Modern transfer chute design can arguably be dated to the development in the late 1980's of what is commonly termed the "Hood and Spoon" transfer chute in Gladstone Queensland. The development was driven by the need for much higher capacity transfers than was traditionally used in the coal industry as we were starting to run conveyor belts much faster and using much wider belts. Further there was a capital cost penalty in going to very wide conveyors so developing transfers that could handle higher material volumes when the belts were running much faster had significant capital cost implications.

The "Hood and Spoon" transfer chute designs were developed by applying the principles of fluid flow to solid materials, along with friction assumptions based on the Coulomb friction model. In applying these principles to transfer chute design, a number of issues were raised, including:
  (a) The accurate calculation of the material flow trajectory off the head pulley of the belt of the discharge belt conveyor. There were many published papers on the subject that are referenced in the publication "*The Transfer Chute Design Manual for Conveyor Belt Systemsi*" (see www.conveyorsystemstechnology.com) written primarily by the present inventor, Colin Benjamin.
  (b) The accuracy of the flow models developed using these principles given the importance of flow control in transfer chute design
  (c) How to manage the high material speeds and the consequent high wear encountered on the wear liners (this was solved for coal by the use of ceramics but proved a much more difficult problem for more abrasive ores)

Using fluid flow principles and the Coulomb friction model for sized washed coal did create reliable transfer chute designs which led to many attempts to utilise "Hood and Spoon" transfer chutes for broader applications with questionable outcomes. This in turn created new areas for active research with particular emphasis on material flow properties and the simulation of them using DEM (Discrete Element Method) as a means of identify areas of high pressure (and therefore higher abrasion or potential flow constraints or both). It also led to variations in transfer chute design and in particular the development of what is known as the WEBA Chute that used a ledge design to create more of an ore-on-ore flow within the transfer chute by allowing the ore to overflow from ledge to ledge, thus minimising abrasive wear as an issue and thus extending the mean time between maintenance considerably.

Separately, the inventor along with colleagues continued on research transfer chute design. The design issues encountered particular problems including:
  (a) Identifying that the trajectory models being used were not accurate. Through sponsored research and reverse engineering over many years, Dr. Shams Huque and Colin Benjamin developed a very accurate calculation that can be now be applied universally to all materials.
  (b) Identifying that complex ores and those containing a diverse range of particle sizes, variable moisture content and cohesive or adhesive ores could not be easily evaluated for their flow properties using any known techniques. It was the pioneering work done by Peter Donecker (see Donecker P. Dynamic Scale Modeling (DSM) of transfer chutes—Australian Bulk handling Review, Sep./Oct. 2011) wherein he developed scale modeling techniques based on the scaling principles of Froude and then extended them to cohesive ores that opened up a methodology of accurately assessing complex material flow.
  (c) Identifying very early that flow in most transfer chutes was very different from the flow encountered in bins and hoppers. The significance of the difference between the two flow regimes is well summarized in a paper "On Dense Granular Flow" by G. D. R. Midi (see Eur.Phys.J.E, 14, 341-365). It characterizes various flow regimes and clearly distinguishes between the flow regime in bins and hoppers and transfer chutes. In bins and hoppers where flow is not continuous, the flow is described as quasi-static flow. Such flow is also evident in some transfer chutes such as rock box type transfers, cascade or overflow transfers such as the "WEBA" chute or transfers that have had small ledges installed to "manage" wear. Flow within transfers where the flow is continuous is described as dense granular flow. The present invention relates to such a continuous flow transfer and as such will be described herein as dense granular flow. The previously mentioned publication is important as it has 100 additional references on this subject and therefore represents a body of research that illustrates the complexity of solid flow through transfer chutes. This publication confines its work to materials that are not cohesive, acknowledging that such materials represented even more complex issues that were beyond current research.

(d) Identifying very early that the material properties of ores could not be scaled. In other words, it was not possible to take a sample of the material being processed and attribute physical properties to it for use in transfer chute design by re-sizing the material, as was often done by others as part of an assessment of the ore characteristics.

The present invention can be applied generally to all types of transfer applications but was specifically developed to manage the complex ores that are encountered in many hard rock applications. The term "complex ores" as used herein refers to ores having any or all of the following characteristics:
(a) Large material size variations.
(b) Variations in moisture content that will create flow variations that must be managed within the transfer chute in order to avoid build-up and blockages.
(c) High volumes of micro fines (−200 micron material) or ultra-fines (−20 micron) that could agglomerate with moisture and thus create cohesive, or worse adhesive, mixtures that could create build-up or blockages within the transfer chute. Conversely these same particles could create dust issues in the absence of moisture.
(d) Highly abrasive ores in general as they create maintenance issues that must be managed.
(e) Lump sizes greater that 150 mm.
(f) Material containing cohesive or adhesive contaminants.

Logically, the most difficult ore types have all of these characteristics.

It is against this background that the present invention has been developed.

SUMMARY OF INVENTION

The present invention stems from the realisation that material flow in transfer chutes is extremely complex and that the "conventional" logic of trying to create sustainable mathematical models was always going to be constrained by the limitations of adequate mathematical models and the limits this created in the development of accurate computer flow simulations. Particularly, the flow of materials through a transfer chute can be affected by:
(a) The material size distribution
(b) The moisture content
(c) The angularity of the ore particles
(d) The shear resistance of the ore particles
(e) The contaminants in the material mass
(f) The material speed
(g) Voidage between particles
(h) Material segregation
(i) Drop heights in the transfer chute (gravitational effects)
(j) Electrostatic attraction between the particles
(k) Material hardness
(l) Chemical and physical bonding between the particles
(m) Boundary layer affects between the ore particles when there is ore-on-ore flow.
(n) Wall angles within the transfer chute Furthermore, after consideration of all these variables (many of which will vary as normal variations in the ore being processed) there also needs to be consideration of the following:
(a) The width, speed and angle of incline of the receiving belt
(b) Dust generation and its control
(c) Spillage generation and its control
(d) Impact and possible damage to the receiving belt.

The present invention is based on the realisation that a different approach was required in assessing these complex interactions, as developing an accurate computational method to calculate the flow of a complex ore was mathematically impossible as there are far too many variables. It is contended that any mathematical method that purports to show the flow of a complex ore in a transfer is at best an approximation.

The flow of solids in the "dense granular phase" is basically controlled by the effective friction between the particles. The effective friction can be described as an aggregate of the many forces and interactions that may occur in the dense granular flow regime that is a characteristic of the flow in the transfer chutes according to the present invention. It is also contend that that Coulomb friction has no relevance in continuous flow transfer chutes despite the many publications that describe its relevance by suggesting that the wall friction of the chute lining should be included in any flow model.

The effective friction of ores varies with the ore composition and all the many variables described above. Through evaluation of transfer chute designs, scale modelling and performance of a series of simple tests on how material flows through transfer chutes, it has been determined that the angle at which the material "sets" up in transfer chutes has a direct correlation to the maximum effective friction of the ores being dealt with in the dense granular flow regime. This angle will hereinafter will be referred to as the "stall angle".

The stall angle has been used to establish a series of design parameters from which transfer chutes according to the invention are designed.

The importance of the stall angle can best be assessed when considering the design of very complex ores, particularly cohesive ores. Conventional logic as seen in a very large number of transfer chutes designed for the iron ore industry in particular over the last 15 years has seen wall angles within transfer chutes typically above 70 degrees from horizontal in order to minimise build-up that could lead to blockages. This in turn has created serious wear issues lower down in the transfer chute due to increased material speed and poor presentation to the receiving belt, leading to problems such as dust, spillage, and belt damage. Also because of the poor presentation to the receiving belt, transfer chutes that do not have a capacity corresponding to the conveyor belts that feed them or take product from them. The reason for steep angles becoming standards was the need to both avoid blockages and attempts to control wear at the same time. Traditionally, when handling highly abrasive ores rock boxes were used. With increasing belt speeds, such designs limited system capacity so different types of transfer chutes were developed. This led to the development of the cascade chute (the pioneering design was from M&J Engineering and termed the WEBA Chute) and the use of rock ledges where wear in the transfer chute was an issue. All these transfers and devices operate in the quasi-static flow regime (or partially so) and in this regime materials containing micro-fines and water or cohesive materials can set up at angles of between 70-90 degrees.

The key to the present invention therefore is ensuring operation in the continuous flow regime as the stall angle for cohesive or adhesive ores is typically no more than about 63 degrees from horizontal. Accordingly, transfer chutes according to the invention are designed with much lower wall angles. In this way, capacity is not limited but rather material speed through the transfer chute is limited, leading to a reduction in wear. Additionally, there is better presentation of the ore onto the receiving belt.

The stall angle may vary with variations in material properties. In relation to the present invention, a primary interest has been with materials exhibiting cohesive or adhesive properties, as these materials represent the most difficult materials to manage in a predictable manner, and through this create reliable transfer chutes that will handle such materials. For these materials reliable stall angles have been established Understanding how the effective friction changes within a transfer chute and using the stall angle as a guide is therefore the theoretical basis behind this invention.

Particularly the effective friction will increase as:
(a) The voidage between the particles is reduced
(b) Segregation occurs in a transfer; that is, the fines (with their higher surface area) will have a higher effective friction for a given mass and therefore will slow down more than the larger particles, thus creating segregation between the larger and smaller particles. This will be reflected in the smaller particles under-flowing the larger particles, thus creating additional boundary layer effects.
(c) Moisture content increases up to the point at which the contained water separates from the ore mass and creates a low friction boundary layer. Generally as water coats the surface, area of each particle uniformly, fines will contain a higher percentage of water than lump, thus exacerbating the effect on the surface friction.
(d) Cohesive/adhesive materials will have a higher effective friction The present invention involves use of the above concepts and the development through empirical means of the various stall angles for a wide range of complex ores. In particular, the present invention stems from the realisation that interpretation of the ore characteristics and translation thereof to angle variations along an ore flow pathway within a transfer chute can lead to creation of a controlled fill, ore-on-ore flow transfer chute. Field results have confirmed the very high accuracy of the design logic and process outlined herein.

However, for the purposes of designing a transfer chute according to the invention, it may be that the stall angle can be considered to be a constant value (regardless of the material type and the material properties), provided that the material has cohesive or adhesive properties, a common characteristic of most complex ores. It is believed that the constant value is about 63 degrees.

Broadly, the invention resides in a transfer chute designed on the basis of achieving a stall angle reflective of effective friction of material flow within the transfer chute in a dense granular flow regime.

More particularly, the invention resides in a transfer chute designed to provide material flow along a flow pathway, with an upper section of the flow pathway accommodating accelerating, flow to maintain dense granular flow regime, an intermediate section of the flow pathway providing consolidated flow in which the flow rate is retarded in a controlled manner avoiding creation of flow turbulence, and a lower section of the flow pathway in which flow is further retarded to create a controlled accumulation and build-up of material upwardly from the lower section.

According to a first aspect of the invention there is provided a methodology for designing a transfer chute, the methodology comprising calculating the trajectory of a material flow into an entrance section of a transfer chute, and establishing parameters for a pathway for material flow between the entrance zone and a discharge zone, the pathway being so designed to create a controlled accumulation and build-up of material, whereby material flowing along the pathway can impinge upon the accumulated material thereby affording resistance to wear caused by the flow of material, the parameters for the pathway including a first wall structure designed to intercept the material flow.

The controlled accumulation and build-up of material is preferably created by adopting a stall angle as herein defined.

In one approach, the adopted stall angle may be the worst case stall angle; that is, the highest stall angle for the materials to be handled.

In another approach, the adopted stall angle may be a constant value regardless of the material type and the material properties. The constant value may be an angle of about 63 degrees.

The controlled accumulation and build-up of material is created by selecting angles presented to the pathway by the first wall structure with reference to the adopted stall angle, whereby, in use, the build-up occurs upwardly from the bottom of the pathway. This provides the controlled fill, ore-on-ore flow transfer chute.

The stall angle of the material being handled may vary with moisture content, fines content and size distribution. It may be desirable that the worst case stall angle of the material being handled be reasonably known. In such circumstances, the transfer chute according to the invention may be designed on the basis of that particular stall angle. In the alternative approach, the transfer chute according to the invention may be designed on the basis of the adopted stall angle being considered to be the constant value regardless of the material type and the material properties.

At the initial contact point within the transfer chute, the angle presented to the pathway by the first wall structure needs to be higher that the adopted stall angle in order to allow the material flow to accelerate and not disperse too widely across the width of the first wall structure.

The angles presented to the pathway by the first wall structure downwardly the along the pathway will then be maintained while the flow path is narrowed, thus consolidating the material flow and increasing the bed depth of accumulated material down the first wall structure. The narrowing of the flow path must be done gradually so as not to create flow turbulence as this will lead to uncontrolled flow.

Finally the angles presented to the pathway by the first wall structure downwardly the along the pathway are gradually changed such that a notional line extending from the outlet of the transfer chute to the point of first contact within the transfer chute represents the adopted stall angle for the material being handled. This will create the necessary conditions for the material to build-up, starting from the bottom or outlet of the transfer chute, up to the point of first contact creating an ore-on-ore pathway along which the material will flow.

Preferably, the lower region is configured to gradually change in slope such that the exit angle at the point of delivery to a receiving belt conveyer is below, and typically well below, the adopted stall angle of the material. In other words, the exit angle is selected such that the material would not normally flow at this angle, thereby decelerating the material flow along the pathway, as mentioned above. This exit angle however is dictated by the need to create an alignment from the exit point to the point of first contact within the transfer chute equivalent to the adopted stall angle.

With this arrangement, the angles presented to the pathway by the first wall structure (as selected with reference to the adopted stall angle of the flow material) are arranged to initially allow the material flow to accelerate in order to maintain material speed and through this consolidate the material flow within the transfer chute and then decelerate to facilitate the building up of material in the lower section of the transfer chute and have this build-up extend upwards within the transfer chute to the point at which the material initially enters the transfer chute.

The first wall structure and any material accumulated thereon provides a flow surface configured to define said angles presented to the pathway by the first wall structure.

Preferably, the flow surface defines an upper region configured to allow the material flow to accelerate in order to maintain material speed and a lower region configured to cause the material flow decelerate to facilitate the building up of material in the lower section of the transfer chute.

The first wall structure and any material accumulated thereon together define the flow surface which represents the back of the transfer chute.

Preferably, the flow surface is so configured by configuring the first wall structure to be of angular construction and manipulating the angles thereof, initially by allowing the material to accelerate by having the angles higher in order to maintain material speed and then by reducing the angles lower in the transfer chute to below the adopted stall angle of the material to thereby slow the material flow (material will not flow under the influence of gravity at angles at or below its stall angle and therefore reducing the angles within the transfer to such angles will cause the material to decelerate). The logic of the reduction in angle is to create a mechanism by which material will start building up in the lower section of the transfer chute and have this build-up extend upwardly to the point at which the material initially enters the transfer chute, as mentioned above.

It is most desirable that the build-up be: (1) sufficient to cover all the areas within the transfer chute where material is likely to flow; and (2) not as deep at or near the initial point of contact at the entrance zone as to affect the way in which the material will flow within the transfer chute. It is for this reason that the angles used equate to the stall angle, as the stall angle represents the angle of natural balance within the flow path of the ore in a continuous flow regime.

In order to achieve the correct balance of build-up, it is desirable that the design be assessed using dynamic scale modelling. This represents a natural precaution given the complexity of the ore flow and the need to test scenarios that are beyond the design concepts; for instance, what might happen if the receiving belt is stopped before the discharge belt. With this approach, a designer would adopt an initial design for modelling, typically based on experience, with the objective of not having excessive build-up and then refining the design accordingly as necessary. Typically, the refinement may include minor adjustments to the angles lower down in the transfer chute. Further, an assessment may be made as to whether a secondary affect known as structural arching is a factor and, if so, adjusting the width at the bottom of the transfer chute by making it slightly wider.

The use of dynamic scale modelling is a very accurate technique. The paper referred to earlier describes the theoretical basis, particularly the fact that the effective friction is proportional to the Inertia Number which in turn can be manipulated to be equivalent to the square root of the Froude Number; that is, it is a scalable property. Cohesive ore properties are simulated from experience and actual comparisons between what was modelled and what was observed in actual transfer chutes using synthetic materials, not ore.

Preferably, the first wall structure further comprises a plurality of formations provided along the pathway adapted to establish the controlled accumulation and build-up of material upon which material flowing along the pathway impinges.

Preferably, the formations are so designed as to provide an arrangement and configuration selected according to the desired flow characteristics of the flowing stream of material along the pathway. This includes, in particular, the size and shape of the formations.

Preferably, the parameters for the pathway further include second and third wall structures disposed on opposed sides of the first wall structure, the first wall structure being sloped to progressively reduce the cross sectional flow area of the pathway in the direction towards the discharge zone.

Preferably, the formations extend from the first wall structure onto adjacent portions of the second and third wall structures.

The formations may comprise ledges disposed at intervals along the pathway.

The ledges have outer edges provide a series of spaced locations which together describe flow surface, wherein the flow surface is configured to define said angles presented to the pathway by the first wall structure. Using ledges facilitates the fabrication of the transfer chute, as fabricating gradual angle changes in plate material can be difficult.

The design is such that once the build-up of accumulated material had been completed, the ledges are preferably fully embedded in the accumulated material.

The profile of the flow surface established by the accumulated material will be different from the profile of the flow surface established by the ledges prior to the latter being fully embedded in the accumulated material (unless excess water flows through the transfer chute). For this reason transfer chutes according to the invention perform better when there is no free water going through the system.

Using ledges also facilitates the construction of the transfer chute, as it is easier to adjust angles presented to the pathway in the transfer chute by adjusting the depth of the ledges than it is to curve the structural body of the transfer.

It is a feature of the invention that a very predictable flow pattern is established within the transfer chute. This permits the design of a transfer chute of modular construction, such as for example by having sections which are vulnerable to wear adapted to be bolted or otherwise connected together in a manner facilitating replacement. This is advantageous as it facilitates ease of installation and also maintenance should the latter be required, with the sections requiring maintenance being easily able to be disassembled and replaced as necessary.

Accordingly, it is apparent that the design methodology involves manipulation of the angles within the transfer chute around the stall angle of the material being transferred, understanding how the stall angle will vary and using this to control the flow within the transfer chute. The final angle within the pathway is selected such that the material would not normally flow at this angle, thereby decelerating the flow. At angles where the material will not flow, structural arching may arise.

It is a feature of the invention that accumulation of material within the transfer chute establishes a flow arrangement in which accumulated and built-up material isolates those parts of the transfer chute likely to be vulnerable to wear by the aggressive nature of the material flow; such a flow arrangement is sometimes referred to as "ore-on-ore" flow.

Preferably, the parameters for the pathway further include second and third wall structures disposed on opposed sides of the first wall structure, the second and third wall structures being sloped to progressively reduce the cross sectional flow area of the pathway in the direction towards the discharge zone. This has the following effects;

(a) In reducing the voidage between the particles, it increases the effective friction and therefore creates a slowing effect on the material flow that complements retardation arising from angle changes on the first wall structure.
  (b) It narrows the overall ore profile to fit the geometry of the receiving belt.
  (c) It deepens the ore flow depth and as the finer material will migrate to the walls due their higher effective friction (larger surface area), causes the larger materials to flow more centrally in the moving ore mass. This facilitates loading onto the receiving belt and reduces impact onto the receiving belt.
  (d) It creates a flow pattern down the side walls of the chute that sees the ore flow partly into itself at the loading point thereby centralising the ore flow and creating a good surcharge angle onto the receiving belt. This is desirable as it eliminates poor belt tracking as an issue and increases the carrying capacity of the receiving belt.

According to a second aspect of the invention there is provided a transfer chute designed in accordance with the methodology according to the first aspect of the invention.

According to a third aspect of the invention there is provided a method of constructing a transfer chute, the method comprising designing the transfer chute according to the methodology of the first aspect of the invention. Preferably, the pathway is established by a wall structure defining the pathway, and wherein the method further comprises constructing the wall structure.

A transfer chute constructed in accordance with the method according to the third aspect of the invention may include any one or more of the preferred features of a transfer chute as referred to above and designed in accordance with the design methodology according to the first aspect of the invention. Accordingly, the method may include incorporation of such features into a transfer chute. It is a feature of the transfer chute that it may be modified to incorporate or vary any one or more of such preferred features, as well as other features, after the transfer chute has been commissioned and is in operation.

According to a fourth aspect of the invention there is provided a transfer chute constructed according to the method of the third aspect of the invention.

According to a fifth aspect of the invention there is provided a transfer chute comprising an entrance zone through which a flow of material can be received, a discharge zone from which the flow of material is delivered, and a pathway for material flow between the entrance and discharge zones, the pathway being configured to create a controlled accumulation and build-up of material, whereby material flowing through the transfer chute can impinge upon the accumulated material thereby affording resistance to wear caused by the flow of material.

The controlled accumulation of material within the transfer chute delivers an accumulation and build-up of material sufficient to provide resistance to wear but not to an extent which would cause a flow blockage.

It is by virtue of the flow material slowing that accumulated material progressively builds-up from the bottom of the pathway to the point of interception in incoming flow through the entrance zone. The build-up of accumulated material is in a manner which creates a reasonably smooth surface confronting the flow material along pathway.

A transfer chute according to the fifth aspect of the invention may include any one or more of the preferred features of a transfer chute as referred to above and designed in accordance with the design methodology according to the first aspect of the invention.

According to a sixth aspect of the invention there is provided a method of transferring bulk materials between first and second locations, the method comprising providing a transfer chute to facilitate the transfer between the two locations, the transfer chute being in accordance with the fourth or fifth aspect of the invention, and further comprising employing the transfer chute to direct material flow from the first location to the second location.

According to a seventh aspect of the invention there is provided a method of transferring bulk materials between first and second locations by way of a transfer chute through which the material flows, the method comprising delivering a flow of the material from the first location to the transfer chute, causing the material flow to initially accelerate within the transfer chute in order to maintain material speed and through this consolidate the material flow within the transfer chute and to then decelerate to facilitate the building-up of material in a lower section of the transfer and have this build-up extend upwards within the transfer chute to the point at which the material initially enters the transfer chute, and discharging material flowing through the transfer chute at the second location.

Implementation of the invention preferably seeks to provide a transfer chute having the following features:

(a) It will not be a constraint to production in that the transfer capacity will be in excess of the fully loaded belt that feeds the transfer and within the transfer the flow will be controlled such that the bulk density of the material being handled will not increase significantly. Further adhesive and/or cohesive materials will be managed such that they will not build-up in an uncontrolled manner that could result in the transfer blocking.
  (b) The transfer is designed in such a manner that its production performance will not change with any ore changes providing those ore property variations have been disclosed at the design stage.

(c) The transfer may or may not incorporate a deflector to turn the ore flow down into the body of the transfer. Whether a deflector is used will depend on the transfer geometry. If a deflector is used it will be designed in a manner that allows it to be easily replaced once the liners are worn in order to minimise maintenance down time.

(d) The transfer components are designed in a manner that maximises their performance life.

The invention is based on managing a very wide variety of extremely complex variables that have confused and frustrated designers of transfer chutes for over 20 years. The need to accommodate the very wide variety of extremely complex variables reflects why transfer chutes have constituted such a major problem in materials handling over the years. The invention adopts an approach which contradicts traditional approaches in relation to the transfer chute design which is predicated on transfer chutes being an extension of bins and hoppers and which is a misconception in the view of the present inventor.

BRIEF DESCRIPTION OF THE DRAWINGS

Further features of the present invention are more fully described in the following description of one non-limiting embodiment thereof. This description is included solely for the purposes of exemplifying the present invention. It should not be understood as a restriction on the broad summary, disclosure or description of the invention as set out above. The description will be made with reference to the accompanying drawings in which.

In the drawings like structures are referred to by like numerals throughout the several views. The drawings shown are not necessarily to scale, with emphasis instead generally being placed upon illustrating the principles of the present invention.

DESCRIPTION OF EMBODIMENT

Figure 1:
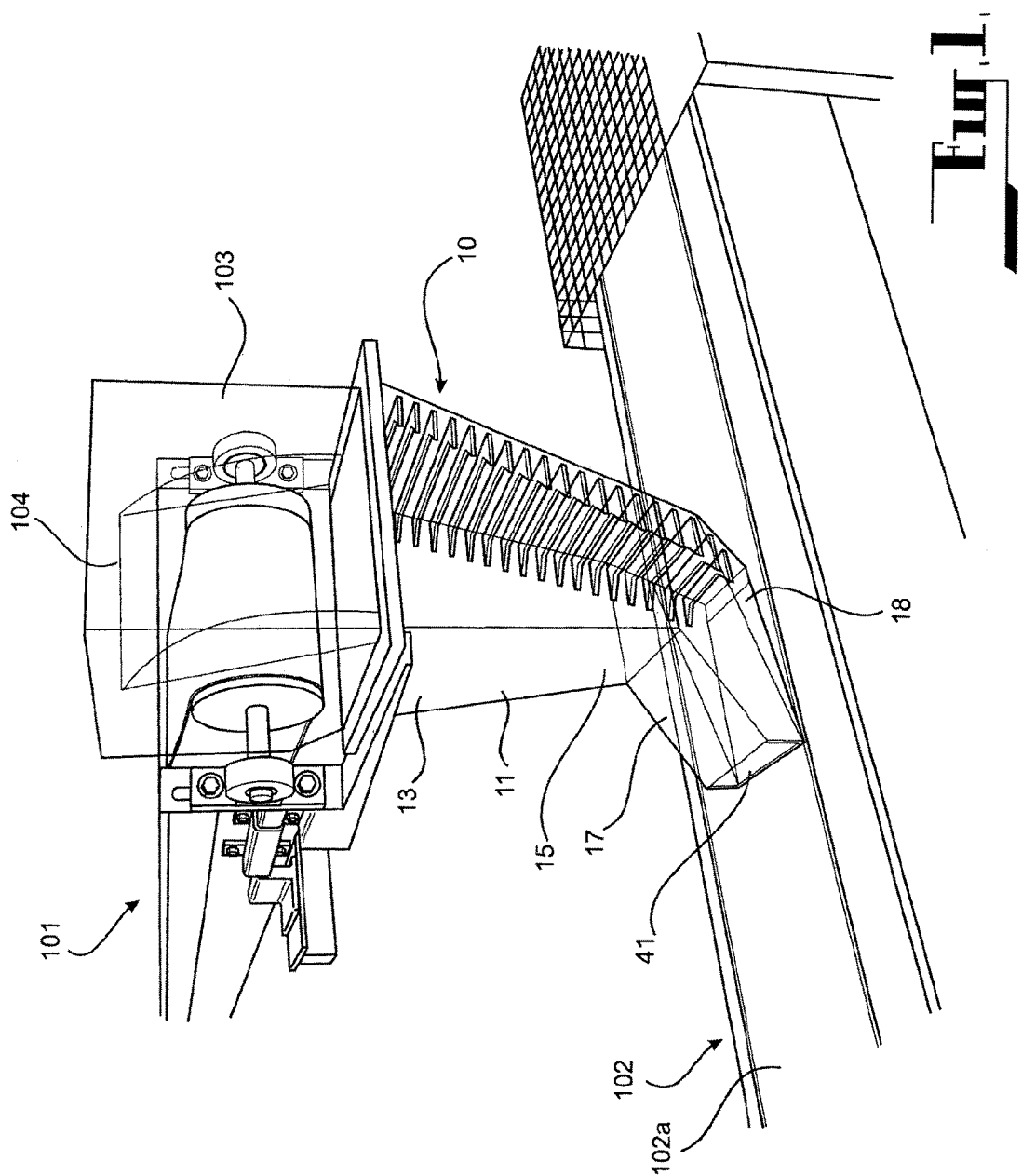
FIG. 1 is a schematic perspective view of an embodiment of the transfer chute according to the invention, the embodiment being configured as a transfer chute operating between a discharge belt conveyor and a receiving belt conveyor.
Figure 2:
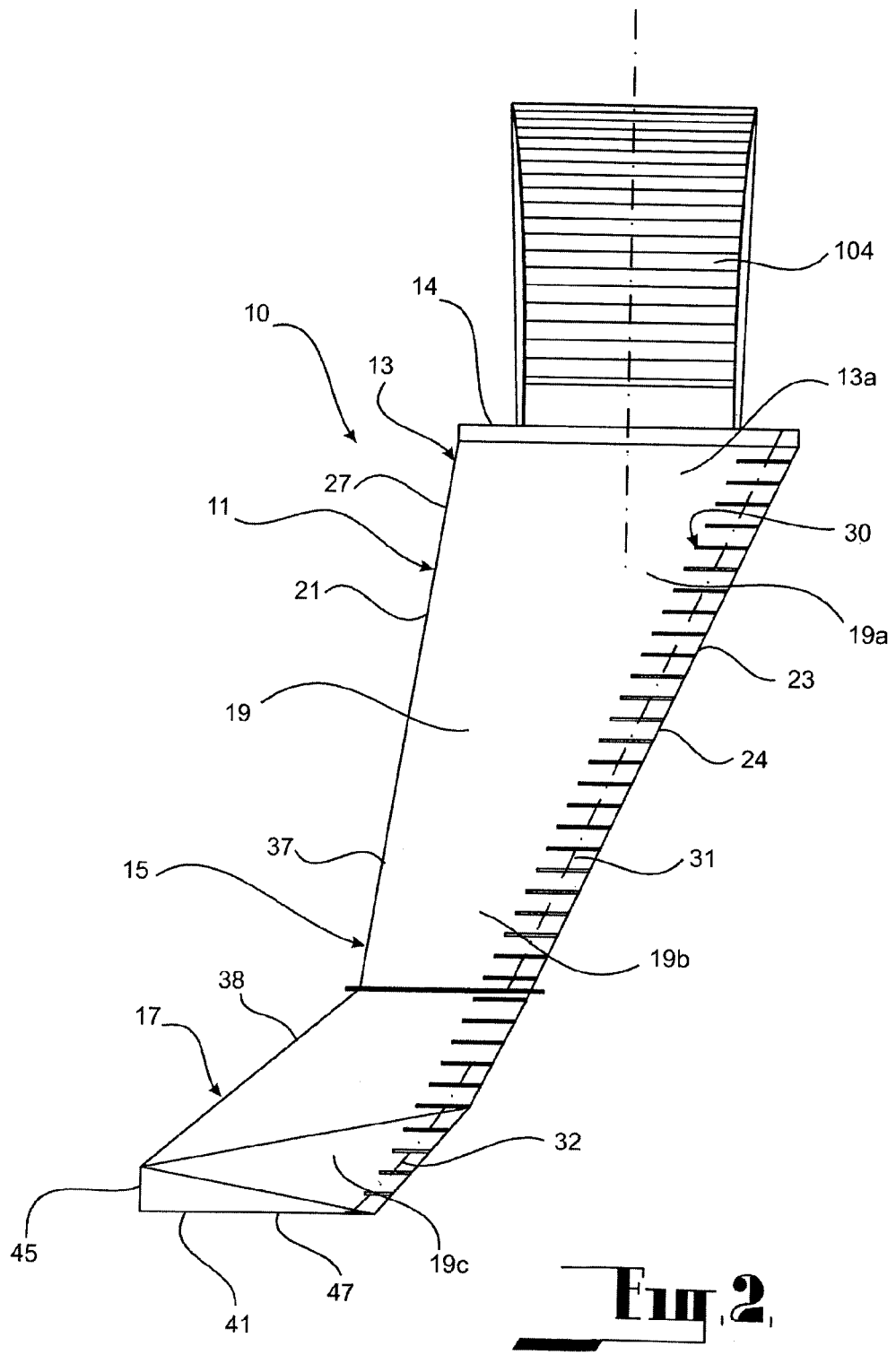
FIG. 2 is a schematic side view of the transfer chute.
Figure 3:
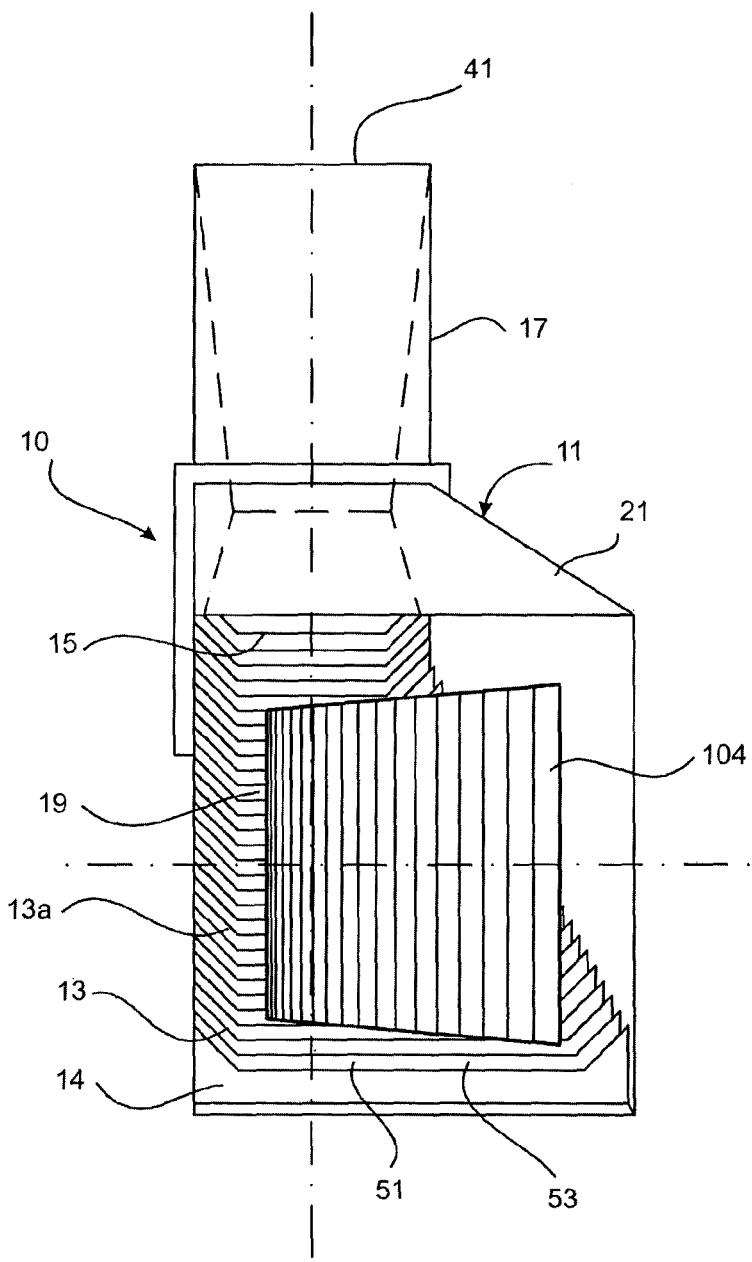
FIG. 3 is a plan view of the transfer chute.
Figure 4:
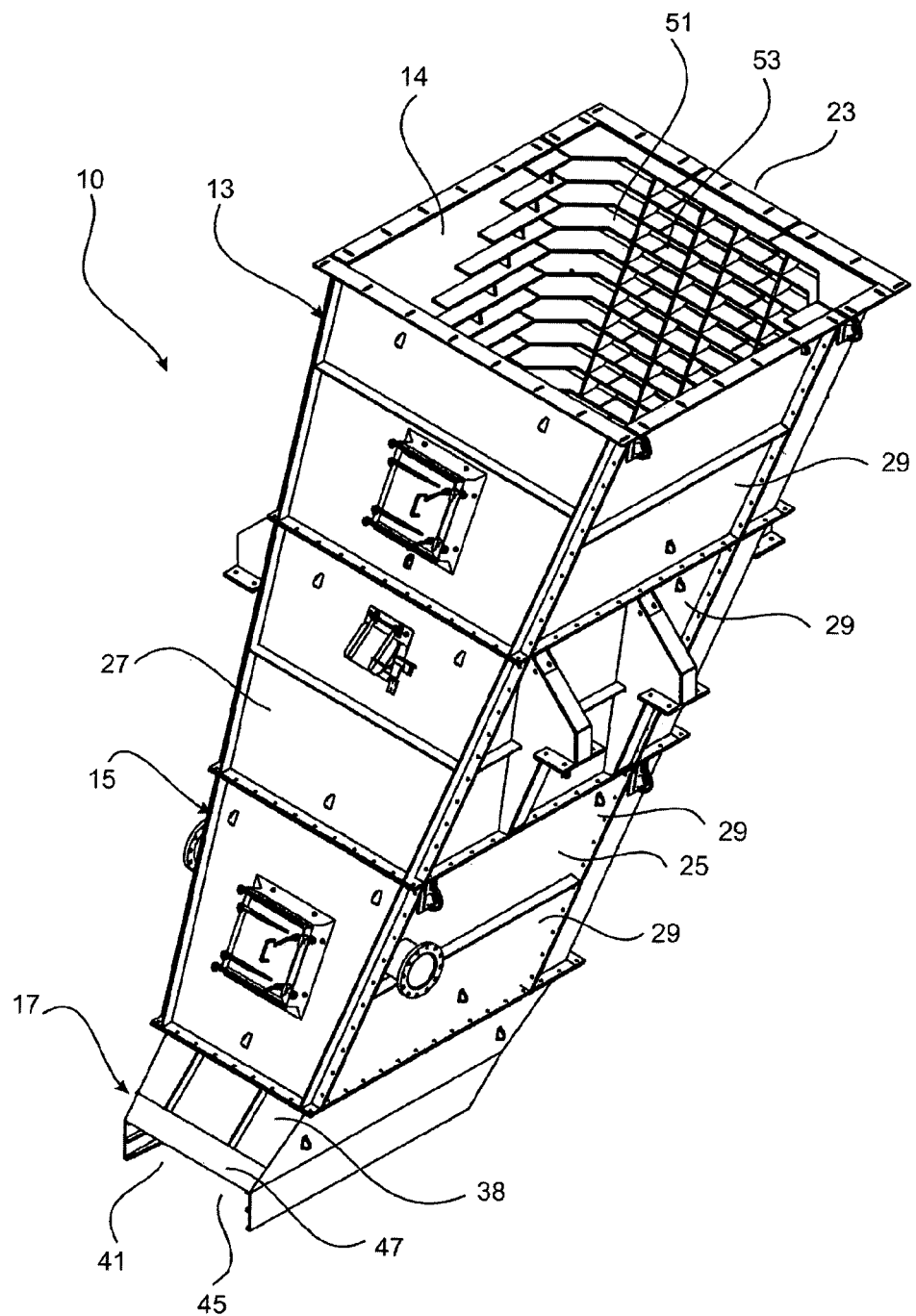
FIG. 4 is a perspective view of an assembly comprising intermediate and lower sections of the transfer chute.
Figure 5:
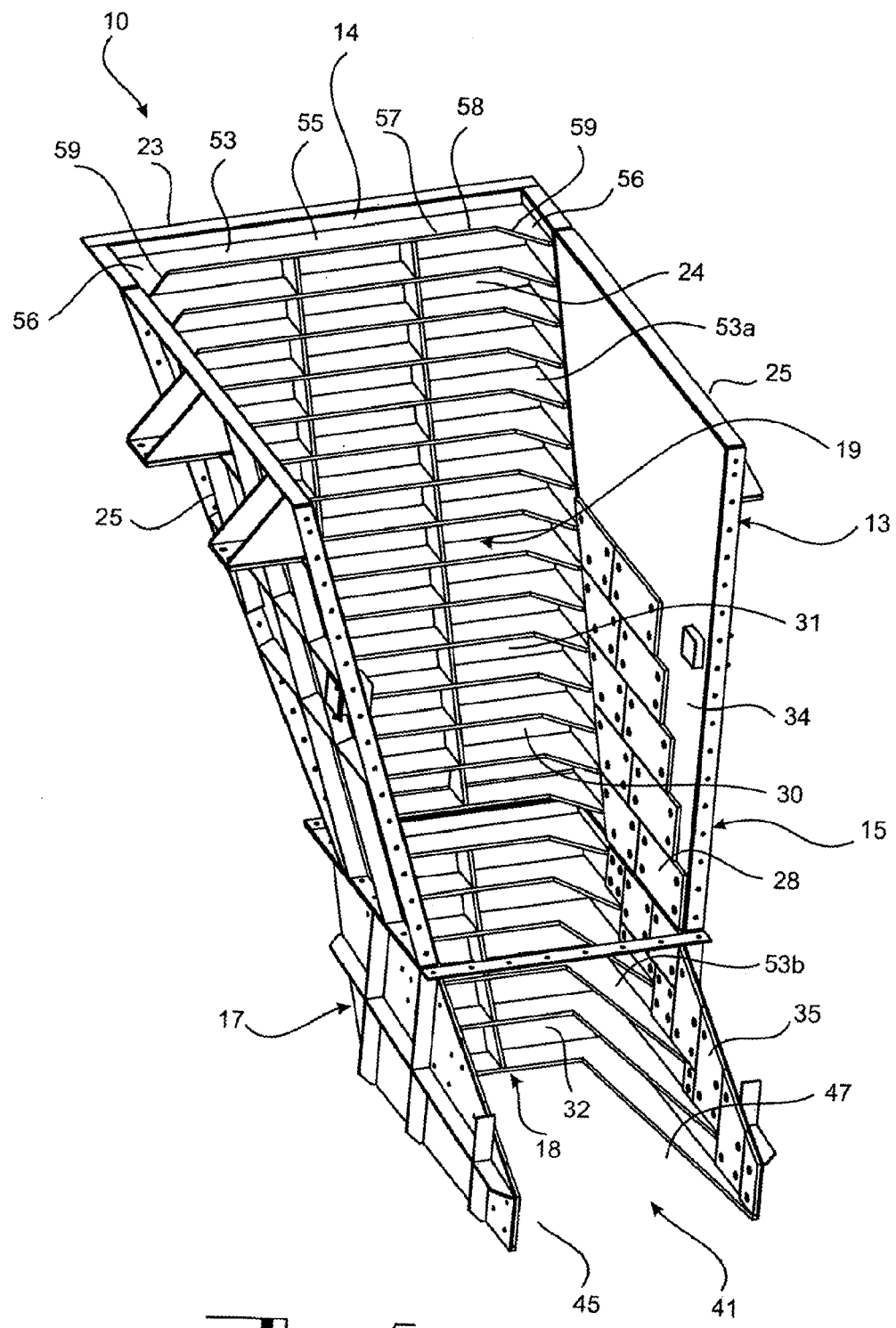
FIG. 5 is a view similar to FIG. 4, with parts removed to reveal the interior of the transfer chute.
Figure 6:
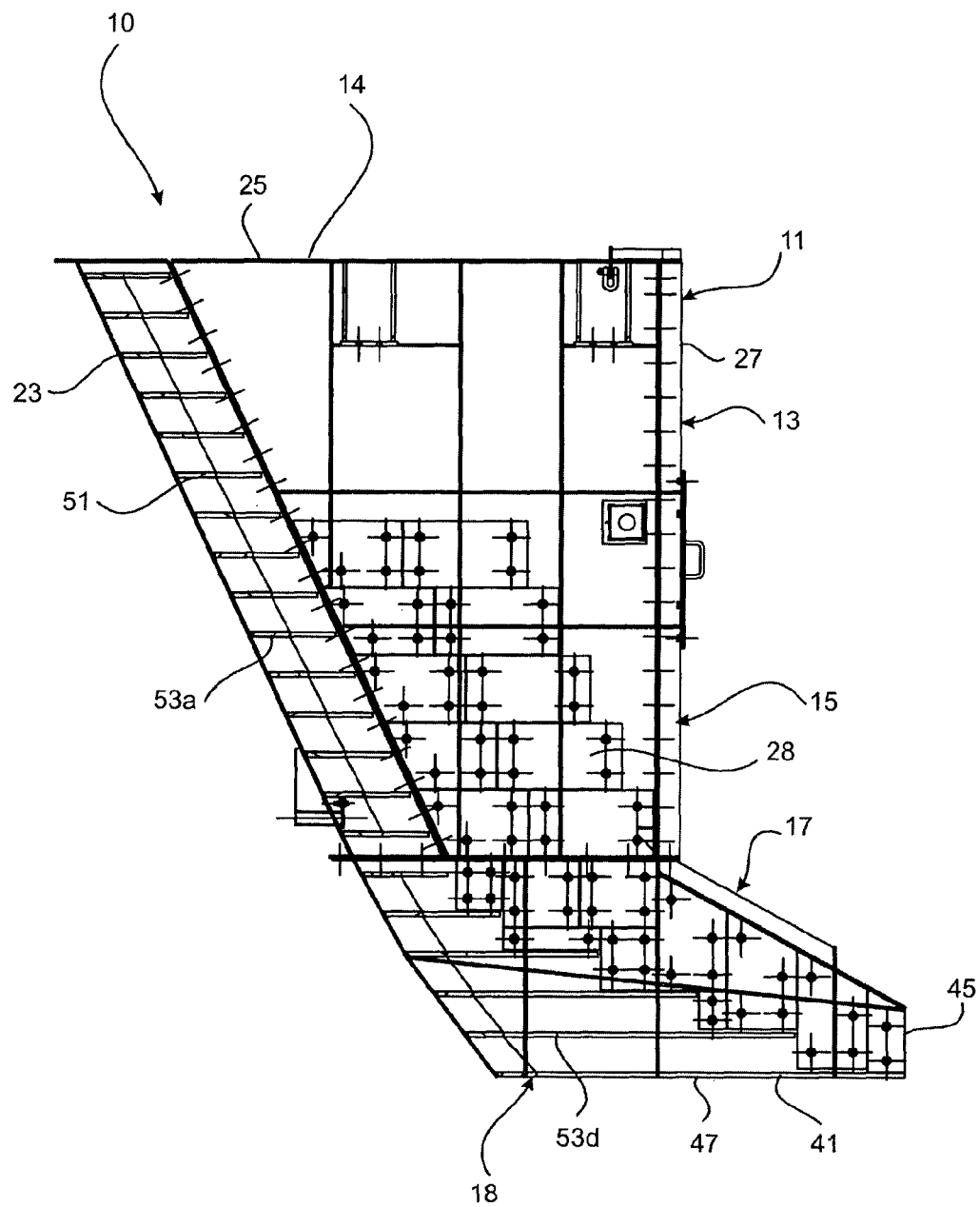
FIG. 6 is a sectional side view of the assembly shown in FIG. 4.
Figure 7:
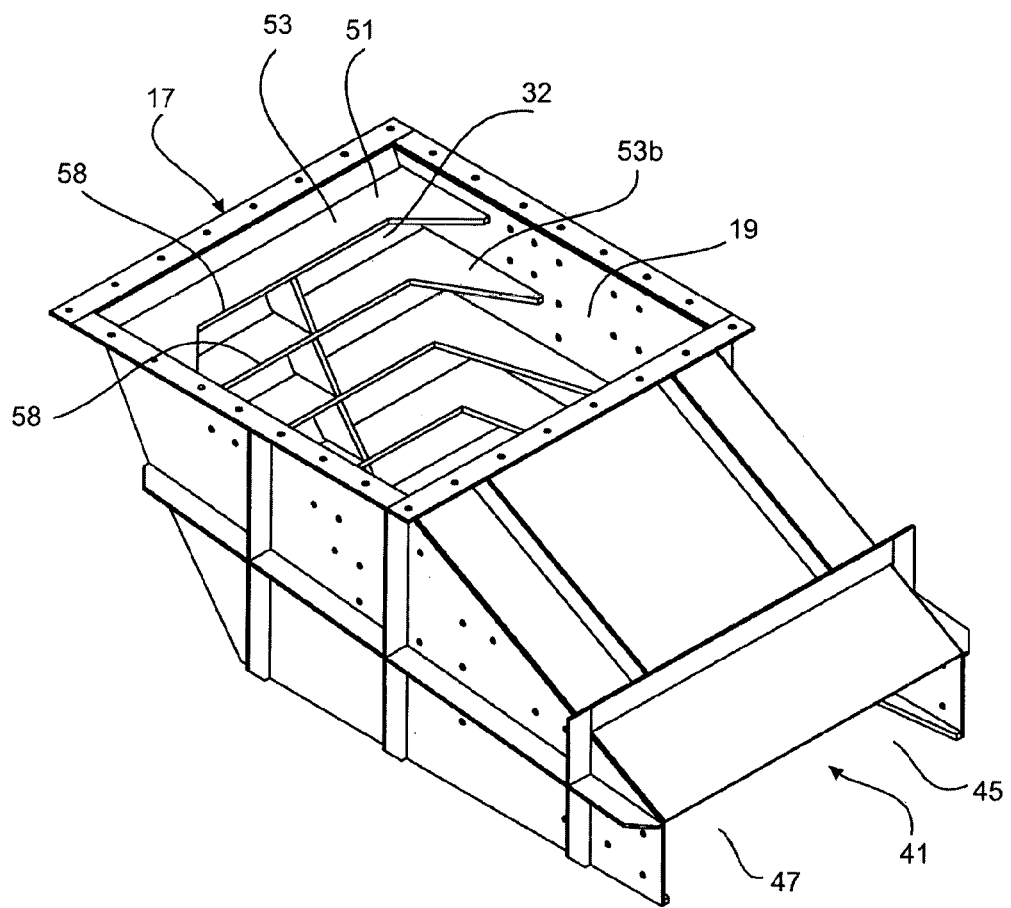
FIG. 7 is a perspective view of the lower section of the transfer chute.

In order to design a transfer chute according to the invention, there are two very important issues that must be addressed. These issues are: (1) the calculation of the material trajectory from the discharge belt into the body of the transfer; and (2) the understanding and development of a flow model for the bulk material being handled such that the elements of the transfer chute can be correctly designed.

There are published trajectory calculation models that will allow the accurate prediction of the material trajectory. The applicants have their own proprietary method that is used for the trajectory calculations. By way of example, the trajectory of a material flow into a transfer chute is calculated in accordance with methodology disclosed in the aforementioned publication "*The Transfer Chute Design Manual for Conveyor Belt Systems*".

Developing a flow model for various ore types is a very complex science. Conventionally the methodology has been an extension of techniques used in the design of bins and hoppers. This involves the sizing of ore and proscribing the properties so determined into various flow model calculations and systems. It also involves the calculation of the wall friction of the lining materials relative to the ore types being transferred. The ore flow in bins and hoppers however is different to that in a transfer chute. Flow in bins and hoppers can be best described as quasi-static flow whereas flow in a transfer chute is best described as dense granular flow. In dense granular flow only the effective friction of the material being handled determines the flow properties of the ore mass within the transfer chute provided that the ore mass flows continuously. Calculating the effective friction is believed to be impossible to do mathematically with any accuracy especially for complex ores that are also cohesive. Further, the large variability of most ore masses adds significant additional complications. Still further, the ore properties necessary for any computational method of assessing the effective friction cannot be obtained using sized ore samples as is done with bin and hopper design. It can however be directly related to the stall angle of the ore. It is also known that:

(a) The stall angle of the ore will vary with moisture content (b) The stall angle of the ore will vary with the ore particle size (c) The stall angle of the ore will vary if there is contained within it contaminants that could modify the cohesive or adhesive properties of the ore.

However, for the purposes of designing a transfer chute according to the invention for most ores that have cohesive or adhesive properties, the stall angle can be considered to be a constant value of about 63 degrees. Such an angle can then be used as the worst case stall angle when design transfer chutes for such materials.

Dynamic scale modelling of transfer chutes began as a technique in the early 1990s and has been in use continuously since that time. It is based on the scaling principles laid down by Froude and scaling is done using the Froude number as the scale factor. Also important is the manner in which this scale modelling was extended to include cohesive and/or adhesive ores, as done by Peter Donecker. It is the ability to model designs accurately using this technique that is very important as there is no other currently known method which available displays such accuracy.

Dynamic scale modelling of transfer chutes is the subject of a paper entitled "*Dynamic Scale Modelling (DSM) of Transfer Chutes*" by Peter Donecker, Bulk Solids Modelling, available at www.bulkhandling.com.au.

By obtaining details of the extent of the variabilities of the ores being processed and then through experimentation or experience relating this to a maximum and minimum stall angle of the ores being processed there is a measure that directly relates to the effective friction range within the transfer that can be used for design purposes. By applying these principles as follows a transfer chute that is based on ore-on-ore flow within the body of the transfer chute can be achieved. Alternatively, it may be that the stall angle can be consisted to be a constant value of about 63 degrees regardless of the material type and the material properties for the purposes of designing the transfer chute.

The key to this design methodology is manipulating the angles within the transfer chute around the stall angle of the material being transferred, understanding how the stall angle will vary or in the case of cohesive or adhesive materials adopting the specified constant value of about 63 degrees, and using this to control the flow within the transfer chute. The final angle within the pathway is selected such that the material would not normally flow at this angle, thereby decelerating the flow to the point it initiates build-up of ore within the lower sections of the transfer chute and extends upwardly to the point where the ore initially contacts the back wall of the transfer chute. At angles where the material will not flow a secondary affect arises, being structural arching. In this case the width of the chute opening may need to be varied.

The first step is accurately calculating the material trajectory as it flows off the head pulley of the discharge belt. The calculation will take into account all material variables that have been disclosed by the customer to the designer. Once this has been done a decision will be made based on the system geometry as to whether there is a requirement for directional control of the incoming flow material downwardly into the transfer chute. Any such directional control may be provided by a curved deflector. Such a curved deflector is usually required if the discharge belt conveyor speed is in excess of 2.0 m/s or there is a change in direction between the discharge and receiving belt conveyors. If a deflector is required it is designed along principles outlined with the aforementioned publication *"The Transfer Chute Design Manual"*.

The essence of this initial step is to have the ore flow dropping vertically off the deflector such that the centre of mass of the ore flow is approximately over the centre line of the receiving belt. If there is enough height between the discharge and receiving belt the flow can be offset and the body of the transfer can be used to centralise the ore flow but it is preferable to have the flow centralised before it enters the body of the transfer.

The aspects of the invention then follow:
1) The stall angle for complex ores that are cohesive and/or adhesive is a constant value of about 63 degrees from horizontal. It is these ores upon which there is particular focus as they represent the most difficult ores to process through a transfer chute. These ore types are also very typical of many mining and ore processing operations.
2) The ore flow is intercepted by a sloped back wall set at right angles to the direction of travel of the receiving belt. This sloped back wall will be set at an angle of between about 65 and 75 degrees to the horizontal depending on the material type and the system geometry. The ideal angles are between 65-70 degrees. In line transfer chutes and transfer chutes containing larger ore sizes should be intercepted at the higher angles in order to avoid the ore lifting off the back wall (bouncing) due to the intercept angle and/or the high compression at the impact zone that will occur with in-line or substantially in-line transfers.
3) The width of the intercepting back wall is set by the outlet width of the deflector with allowance for material spread where it intercepts the back wall or in cases' where no deflector is used, the width of the ore stream flowing from the head pulley of the discharge belt conveyor. The back wall is then tapered down its length such that it is nominally about one-third of the width of the receiving belt at the bottom of the transfer chute. The extent of tapering may however vary, as will be explained later. The angle of taper should be no more than about 10 degrees as the ore speed must be balanced with the cross sectional flow area in which it is being contained.
4) The sloped wall and the adjoining walls will be constructed such that they have ledges. Ledges are used to facilitate the accumulation of material within the transfer chute and also to retain the accumulation in the transfer chute. Ledges also facilitate the construction of the transfer by eliminating the need for curved, structural members. These ledges will start from just above the initial point of intercept and all down the back wall and be extended onto the adjoining walls such that all the areas where the ore could flow will contain ledges. The ledges will be spaced according to the material size and ore types being handled but typically could be about 150-200 mm apart and have a depth of about 200 mm. It is not desirable to have the ledges any closer due to fabrication costs, any wider may not achieve the objective outlined later.
5) In order to promote the final build-up pattern within the transfer chute, the abutment between the back wall and the side walls should have about a 45 degree in-fill ledge or curved section incorporated This will eliminate tight angles within the transfer chute where material could jam causing uncontrolled build-up or a blockage. It will also facilitate flow within the transfer chute by shaping the back wall of the transfer in a similar way as the idealised flow pattern which is desired to be created.
6) The ore flow speed will not accelerate significantly if there is ore-on-ore flow and the angles along which it is flowing is within about a few degrees of the stall angle of the given ore. Utilising this, the material speed down the transfer chute can be manipulated by adjusting the slope of the back wall. A key element of this invention is first maintaining sufficient speed within the transfer of the entire ore flow such that the transfer capacity is in excess of the conveyor system that feeds the transfer chute and through this ensuring that even very cohesive/adhesive materials will continue to flow by maintaining continuous flow.
7) Using the above factors an ore-on-ore flow surface can be achieved by slowing the material down sufficiently by reducing the angle of the back wall to below the stall angle of the material. This is done by gradually changing the initial slope of the back wall so that the final exit angle from the transfer chute transcribes, if a notional line is drawn back to the initial impact point within the transfer chute, the stall angle of the ore (the worst case stall angle is always used). The logic of creating such an alignment within the transfer chute is that the stall angle represents the angle of natural balance for the ore in the dense granular flow regime and creation of such an alignment ensures that there is sufficient build-up to minimise wear while not allowing the ore to continue to build such that the transfer chute would then block or limit flow in some way. The exit angle is dictated by the height of the transfer chute and the stall angle of the material. The exit angle is usually adjusted by adjusting the angular disposition of the last 5 to 15 ledges by 1 to 3 degrees each. Logically, the higher the transfer chute the greater the slowing required and therefore the greater the angle change. Conversely, more adhesive ores require smaller angle changes. Through this the slowing ore creates build-up on the ledges from the bottom and extending up to the initial intercept point in a manner that creates a reasonably smooth surface of ore that approximates the stall angle, fully embedding the ledges that are within the flow area of the ore within the transfer chute.

The step above is usually done in conjunction with a narrowing of the cross-sectional area of the flow path of the transfer chute, which also increases the effective friction. This may be done by inclining the side walls inwardly down the transfer chute such that the outlet profile matches the presentation profile required for the receiving belt. The inclination of each side walls is typically about 10 degrees.

The foregoing will be better understood by reference to the embodiment of a transfer chute which has been designed and constructed according to the invention.

The embodiment is directed to a transfer chute for transferring particulate bulk material, such as iron ore, between two locations.

The transfer chute is designed comprising calculating the trajectory of a material flow into an entrance section of a transfer chute, and establishing parameters for a pathway for material flow between the entrance zone and a discharge zone, the pathway being so designed to create a controlled accumulation and build-up of material, whereby material flowing along the pathway can impinge upon the accumulated material thereby affording resistance to wear caused by the flow of material, the parameters for the pathway including a first wall structure designed to intercept the material flow.

The controlled accumulation and build-up of material is created by selecting angles presented to the pathway by the first wall structure with reference to the stall angle of the flow material whereby, in use, the build-up occurs upwardly from the bottom of the pathway.

The angles presented to the pathway by the first wall structure (as selected with reference to the stall angle of the flow material) are arranged to initially allow the material flow to accelerate in order to maintain material speed and through this consolidate the material flow within the transfer chute and then decelerate to facilitate the building up of material in the lower section of the transfer chute and have this build-up extend upwards within the transfer chute to the point at which the material initially enters the transfer chute.

The first wall structure and any material accumulated thereon provides a flow surface configured to define said angles presented to the pathway by the first wall structure. The flow surface defines an upper region configured to allow the material flow to accelerate in order to maintain material speed and a lower region configured to cause the material flow decelerate to facilitate the building up of material in the lower section of the transfer chute.

The upper region of the flow surface is preferably so configured by being disposed at an angle above the stall angle of the flow material.

The lower region is preferably configured to gradually change in slope such that the exit angle at the point of delivery to receiving belt conveyer is below the stall angle of the material concerned, thereby decelerating the material flow along the pathway.

The first wall structure and any material accumulated thereon defines the flow surface which represent the back of the transfer chute.

The first wall structure is so configured by making it of angular construction and manipulating the angles thereof, initially by allowing the material to accelerate by having the angles higher in order to maintain material speed and then by reducing the angles lower in the transfer chute to below the stall angle of the material to thereby slow the material flow (material will not normally flow under the influence of gravity at angles below its stall angle and therefore reducing the angles within the transfer to such angles will cause the material to decelerate). The logic of the reduction in angle is to create a mechanism by which material will start building up in the lower section of the transfer chute and have this build-up extend upwardly to the point at which the material initially enters the transfer chute, as mentioned above. This build up will create its own flow angle within the transfer chute that is desirably at or close to the stall angle of the material.

It is most desirable that the build-up be: (1) sufficient to cover all the areas within the transfer chute where material is likely to flow; and (2) not so deep at or near the initial point of contact at the entrance zone as to affect the way in which the material will flow within the transfer chute. In order to achieve this, a notional line is drawn from the exit of the transfer chute to the point of initial contact, with the line being at an angle close to or the same as the stall angle of the most cohesive material being handled.

This line then dictates the final exit angle from the chute given the back wall angle is changed gradually lower down in the transfer chute. The ledge design is then configured as above, first allowing acceleration then gradually slowing by reducing the angles within the transfer chute to meet such an alignment.

In order to achieve the correct balance of build-up, it is desirable that the design be assessed using dynamic scale modelling. This allows the flow angles to be assessed based on various parameters and conditions to ensure the angles within the transfer will not create a blockage event. With this approach, a designer can refine the angles if necessary. Typically, the refinement may include minor adjustments to the angles lower down in the transfer chute. Further, an assessment may be made as to whether a secondary affect known as structural arching is a factor and if so adjusting the width at the bottom of the transfer chute by making it slightly wider.

The upper region of the flow surface is preferably designed to provide a slope at an angle of about 65 to 75 degrees to the horizontal depending on the material type and system geometry. More preferably, the upper region of the flow surface is designed to provide a slope at an angle of about 65 to 70 degrees to the horizontal.

The lower region of the flow surface is preferably designed to provide a slope at an angle of about 55 degrees to the horizontal at the delivery point, although in some taller transfers exit angles down to about 40 degrees are possible.

The first wall structure preferably further comprises a plurality of formations provided along the pathway adapted to establish the controlled accumulation and build-up of material upon which material flowing along the pathway impinges.

The formations are preferably so designed as to provide an arrangement and configuration selected according to the desired flow characteristics of the flowing stream of material along the pathway. This includes, in particular, the size and shape of the formations.

The parameters for the pathway preferably further include second and third wall structures disposed on opposed sides of the first wall structure, the first wall structure being sloped to progressively reduce the cross sectional flow area of the pathway in the direction towards the discharge zone.

The formations preferably extend from the first wall structure onto adjacent portions of the second and third wall structures.

The formations preferably comprise ledges disposed at intervals along the pathway.

The ledges in this embodiment have outer edges which provide a series of spaced locations which together describe a flow surface configured to define said angles presented to the pathway by the first wall structure.

Using ledges also facilitates the construction of the transfer chute, as it is easier to adjust angles presented to the pathway in the transfer chute by adjusting the depth of the ledges than it is to curve the structural body of the transfer.

With this arrangement, a very predictable flow pattern can be established within the transfer chute. This permits the design of a transfer chute of modular construction, such as for example by having sections adapted to be bolted or otherwise releasably connected together. This is advantageous as it facilitates ease of installation and also maintenance should the latter be required, with the sections requiring maintenance being able to be disassembled and replaced as necessary.

If ledges are used then they are assembled in a manner that their surface alignment describes the flow pattern that has been selected for the transfer chute. At the exit point, the final angle is sufficiently less than the stall angle as to cause the material to build-up, and this build-up to continue until a new flow surface has been created that will approximate the flow angle of the ore. This final angle is selected by ensuring that from the point of initial contact on the back wall of the transfer chute to the exit point is in fact equivalent to the worst case stall angle for the ore being processed.

In this embodiment, ledges are used and each ledge comprises a central ledge section on the first wall, and two end ledge sections on the adjacent portions of the second and third walls.

Preferably, each ledge further comprises outer edge configured as a central edge section and two opposed end edge sections, the two opposed end edge sections being disposed angularly with respect to the a central edge section.

The ledges preferably start at a location above the point at which the first wall structure intercepts the material flow and continue along the length of the pathway where material flow can occur.

The particular ledges accommodated within the discharge zone preferably progressively increase in width in the direction towards a discharge opening in the discharge zone, the width being the distance from the edge of the ledge adjacent the back wall to the opposed edge of the ledge confronting the formations provided along the pathway. This is to accommodate the increased bed depth of material as the cross sectional area of the pathway is reduced which in turn means material will start contacting the side walls. In this way, the progressively increasing width of the ledges serves to retain in the discharge zone and therefore mitigate wear.

The design is such that once the build-up of accumulated material had been completed, the ledges in the flow area are preferably fully embedded in the accumulated material. There will be little or no build-up on the ledges outside the normal flow area The first wall structure preferably tapers along its length from the entrance zone to the discharge zone.

The angle of taper should preferably not exceed about 10 degrees.

Where the transfer chute is arranged to transfer bulk material to a receiving belt conveyor at the discharge zone, the orientation of the transfer chute is such the plane of the first wall is transverse to the direction of travel of the receiving belt.

The first wall structure preferably tapers along its length from the entrance zone to the discharge zone. Preferably, the first wall structure tapers to a width of about one-third of the width of the receiving belt.

The trajectory of a material flow into an entrance section of a transfer chute is in this embodiment calculated in accordance with methodology disclosed in the aforementioned publication "*The Transfer Chute Design Manual for Conveyor Belt Systems*".

The methodology preferably further includes assessment as to any requirement for directional control of the incoming flow material downwardly into the transfer chute. The need for any such directional control is typically dependent upon the system geometry having regard to the trajectory of incoming flow material.

The controlled accumulation of material within the transfer chute delivers an accumulation and build-up of material sufficient to provide resistance to wear but not to an extent which would cause a flow blockage.

It is by virtue of the flow material slowing that accumulated material progressively builds-up from the bottom of the pathway to the point of interception in incoming flow through the entrance zone. The build-up of accumulated material is in a manner which creates a reasonably smooth surface confronting the flow material along the pathway.

The embodiment will now be described in more detail, with reference to the accompanying drawings.

The embodiment shown in the drawings is directed to a transfer chute 10 for transferring particulate bulk material, such as iron ore, in a belt conveying operation; specifically, from an upper discharge belt conveyor 101 to a lower receiving belt conveyer 102. In the arrangement shown in FIG. 1, an enclosure 103 accommodating a deflector 104 is installed between the upper discharge belt conveyor 101 and the transfer chute 10.

The transfer chute 10 comprises a chute body 11 defining an entrance section 13 having an entrance opening 14, an intermediate section 15, and a discharge section 17. In this embodiment, the chute body 11 is of modular construction, with the entrance section 13, the intermediate section 15 and the discharge section 17 fabricated separately of each other and adapted to be connected together. In the arrangement shown, the entrance section 13, the intermediate section 15 and the discharge section 17 are adapted to be bolted together at flanged connections, but other connection arrangements can of course be used. In this embodiment, the entrance section 13, the intermediate section 15 and the discharge section 17 are each also of modular construction so that modular parts thereof can be replaced if necessary. The need for replacement may arise, for example, as a result of wear or because of a requirement to change one or more features of the transfer chute. Further, the modular construction is advantageous as it facilitates ease of installation and also maintenance should the latter be required, with the sections requiring maintenance being able to be disassembled and replaced as necessary.

The discharge section 17 has a delivery point 18 at which particulate bulk material is delivered to the lower receiving belt conveyer 12.

The entrance section 13 defines an entrance zone 13a for receiving particulate bulk materials from the discharge belt conveyor 101. From the entrance section 13, the particulate bulk materials flow into and along the intermediate section 15 to the discharge section 17 which directs the bulk materials onto the lower receiving belt conveyer 102.

The chute body 11 defines a pathway 19 along which the bulk materials can flow under the influence of gravity from the entrance section 13 to the discharge section 17.

In this embodiment, the deflector 104 is provided to direct the trajectory of incoming flow material issuing from the discharge belt conveyor 101 downwardly into the chute body 11 through the entrance opening 14. Other embodiments may not necessarily require a deflector.

It is desirable for the incoming flow material to have a centre of mass aligned approximately with the centre of the lower receiving belt conveyer 102. Preferably, incoming flow material is so centralised before entering the transfer chute 10.

Where the incoming flow material is not so centralised before entering the transfer chute 10, there are several options available. One option is to design the deflector to achieve this objective, typically by having the bulk materials dropping vertically off the deflector.

However, if there is sufficient height between the discharge and receiving belt conveyor 101, 102, another option is to use the transfer chute itself to centralise the material flow.

The transfer chute 10 comprises a wall structure 21 which defines the pathway 19. The wall structure 21 includes a rear wall structure 23 having a back wall 24, two side wall structures 25 and a front wall structure 27. In this embodiment, the wall structure 21 is incorporated in the entrance section 13, the intermediate section 15, and the discharge section 17.

In the arrangement shown, the two side wall structures 25 are fitted with replaceable wear liner plates 28 of known kind.

The wall structure 21 is of modular construction, comprising wall sections 29 which can be assembly together. The particular wall sections 29 which are assembled to provide the wall structure 21 are selected according to the design requirements for the transfer chute 10.

The rear wall structure 23 and any material accumulated thereon represents the back 30 of the transfer chute 10 along which material flows. Material initially flows into the entrance section 13 which represents the upper section of the rear wall structure 23 and impinges upon the back 30.

The back 30 of the transfer chute 10 along which material flows is configured to initially allow the material flow to accelerate in order to maintain material speed and through this consolidate the material flow within the transfer chute, and then decelerate to facilitate the building up of material in the lower section of the transfer chute and have this build-up extend upwards within the transfer chute to the point at which the material initially enters the transfer chute.

This provides controlled accumulation and build-up of material upwardly from the bottom of the pathway 19.

The rear wall structure 23 comprises an upper portion 31 and also a lower portion 32 disposed within the discharge section 17.

Similarly, the side wall structure 25 each include an upper portion 34 and a lower portion 35, and the front wall structure 27 includes an upper portion 37 and a lower portion 38.

Figure 8:
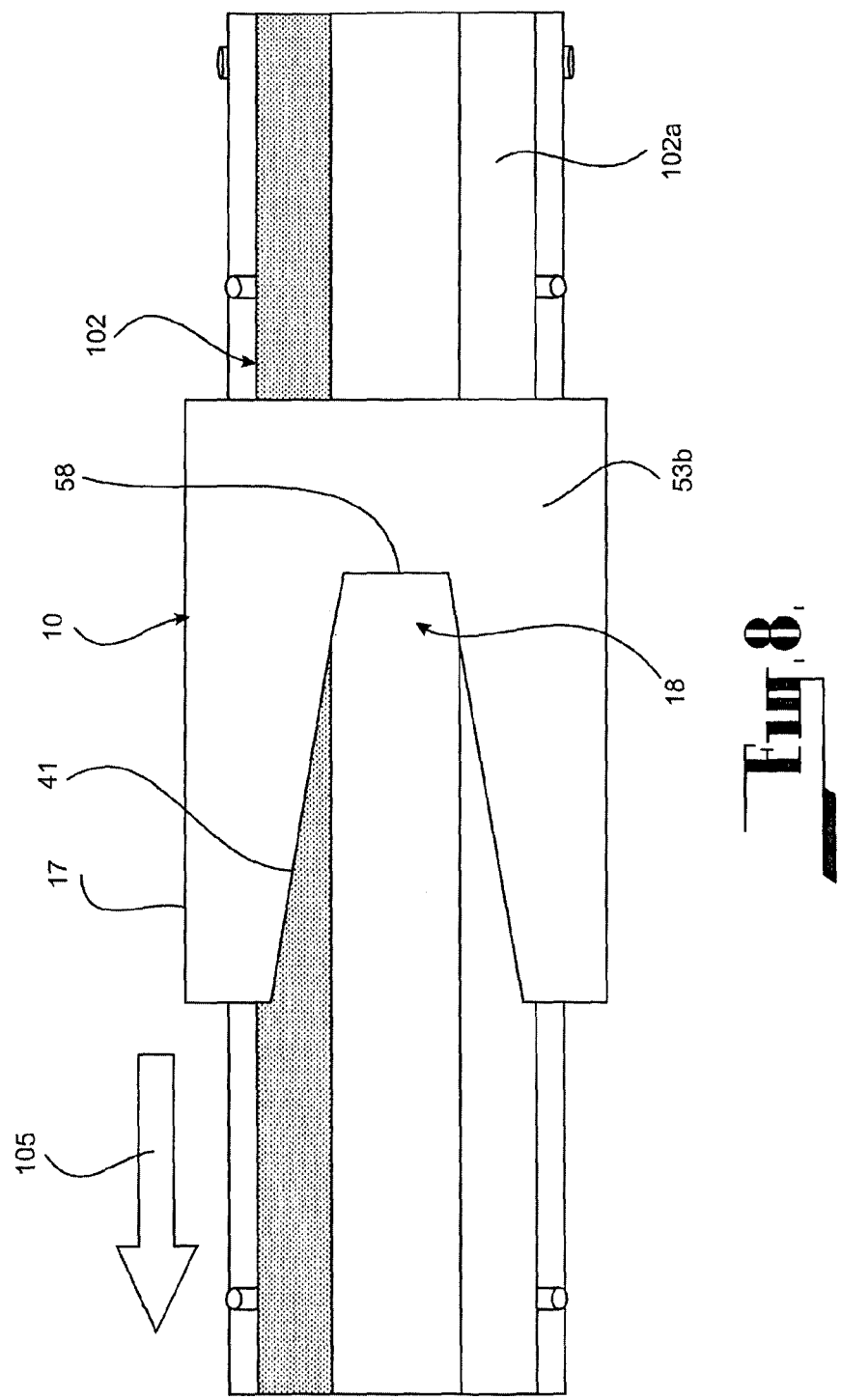
FIG. 8 is a schematic view of a discharge end of the transfer chute depicting delivery of material onto the receiving belt conveyor.

The orientation of the transfer chute 10 with respect to the receiving belt conveyor 102 is such the plane of the rear wall structure 23 is transverse to the direction of travel of the receiving belt 102a, as best seen in FIG. 8.

The rear wall structure 23 and any material accumulated thereon provides a flow surface 40 configured to define angles presented to the pathway 19. The flow surface 40 is depicted schematically by a dotted line in FIG. 9. The flow surface 40 defines an upper region 40a configured to allow the material flow to accelerate in order to maintain material speed and a lower region 40b configured to cause the material flow decelerate to facilitate the building up of material in the lower section of the transfer chute.

The upper region 40a is so configured by being disposed at an angle to above the stall angle of the flow material.

The lower region 40b is configured to gradually change in slope such that the exit angle at the delivery point 18 is at or below the stall angle of the material concerned, thereby decelerating the material flow along the pathway 19.

More particularly, the rear wall structure 23 is so configured by making it of angular construction and manipulating the angles thereof, initially by allowing the material to accelerate by having the angles higher in order to maintain material speed and then by reducing the angles lower in the transfer chute to at or below the stall angle of the material to thereby slow the material flow (material will not normally flow under the influence of gravity at angles at or below its stall angle and therefore reducing the angles within the transfer to such angles will cause the material to decelerate). The logic of the reduction in angle is to create a mechanism by which material will start building up in the lower section of the transfer chute and have this build-up extend upwardly to the point at which the material initially enters the transfer chute, as mentioned above. This build up will create a new flow angle within the transfer chute.

The arrangement is so configured that the upper region 40a of the flow surface 40 slopes at an angle of about 65 to 75 degrees to the horizontal, depending on the material type which the transfer chute 10 is designed to handle and the geometry of the transfer chute. This angle is greater than the adopted stall angle, which in this embodiment is 63 degrees. The angle ultimately selected may be based on the speed at which the stream of material undergoing transfer is intended to flow along the pathway 19. In this regard, it is desirable to maintain sufficient speed along the pathway 19 such that the transfer capacity of the chute at the discharge section 17 is in excess of the reception capacity of the receiving belt conveyor 102. This ensures that the transfer chute can accommodate very cohesive and adhesive materials.

The slope of the lower region 40b of the flow surface 40, which extends into the discharge section 17 and to the delivery point 18, is gradually changed such that the exit angle at the delivery point 18 is at or below the adopted stall angle of the material concerned. In other words, the exit angle within the pathway 19 is selected such that the material would not normally flow at this angle, thereby decelerating the material flow along the pathway.

The rear wall structure 23 tapers along its length from the entrance zone defined by the entrance section 13 to the discharge zone defined by the discharge section 17. The rear wall structure 23 preferably tapers to a width of about one-third of the width of the receiving belt 102a of the receiving belt conveyor 102. Preferably, the angle of taper does not exceed 10 degrees.

The discharge section 17 is disposed above the lower receiving belt conveyor 102 and includes a discharge opening 41 which is at the delivery point 18 and which is defined by an open bottom 43 and an open front 45. The open front 45 is provided by the lower portion 38 of the front wall 27 terminating at edge 47 above the open bottom 43.

The discharge section 17 is configured to extend forwardly to the open front 45, as shown in the drawings. This is accommodated by the angular disposition of the lower portion 38 of the front wall 27 and the corresponding extended configuration of the lower portions 35 of the two side walls 25.

The transfer chute 10 further comprises a plurality of formations 51 provided along the pathway 19 adapted to establish the controlled accumulation and build-up of material upon which material flowing along the pathway impinges. The formations 51 are in an arrangement and configuration selected according to the desired flow characteristics of the flowing stream of material along the pathway 19. This includes, in particular, the size and shape of the formations.

In this embodiment, the formations 51 comprise ledges 53 disposed at intervals along the pathway 19. The ledges 53 are mounted on the wall structure 21, extending outwardly from the back wall 24.

The ledges 53 are arranged in a step formation along the pathway 19. With such an arrangement, the accumulating material ultimately embeds the ledges 53 and presents a protective covering which isolates the material flow along the pathway 19 from the ledges 53 and also from adjacent wall surfaces of the wall structure 21. Once the ledges 53 are fully embedded, the accumulated material establishes the flow surface 40. The profile of the flow surface 40 established by the accumulated material will likely be slightly different from the profile of the flow surface 40 established by the ledges 53 prior to the latter being fully embedded in the accumulated material. In any event, however, each flow surface so defined will include the upper region 40a and the lower region 40b, as discussed above. The flow angle defined by the flow surface 40 established by the accumulated material is believed to approximate the adopted stall angle of the flow material.

Each ledge 53 comprises a central ledge section 55 on the rear wall structure 23, and two end ledge sections 56 on the adjacent portions of the side walls 25.

Each ledge 53 presents an outer edge 57 configured as a central edge section 58 and two opposed end edge sections 59, the two opposed end edge sections 59 being disposed angularly with respect to the a central edge section, as shown in the drawings. The width of each ledge 53 is represented by the distance between the outer edge section 58 and the opposed inner edge of the ledge abutting the rear wall structure 23.

Figure 9:
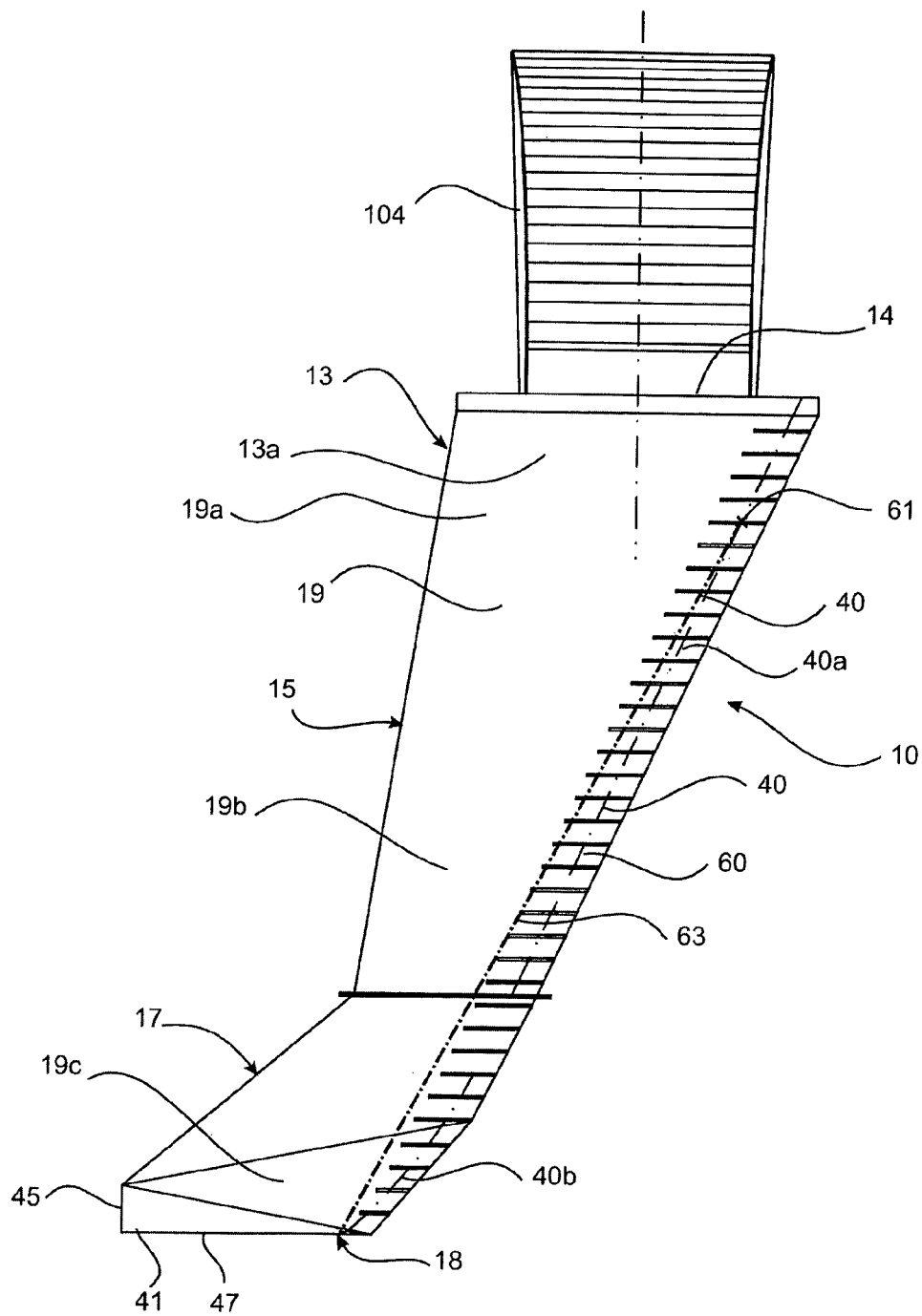
FIG. 9 is a schematic side view of the transfer chute, with markings showing a flow surface which confronts a materials flow pathway within the transfer chute and which is developed by accumulated material in the transfer chute.

The central edge sections 58 of the ledges 53 provide a series of spaced locations which together describe the profile of the flow surface 40 prior to embedding of the ledges, as depicted by dotted line 60 in FIG. 9. Once the central edge sections 58 of the ledges 53 are fully embedded, the surface of the accumulated material confronting the pathway 19 defines the flow surface. As mentioned above, the profile of the flow surface 40 established by the accumulated material will likely be slightly different from the profile of the flow surface 40 established by the ledges 53, or more particularly the central edge sections 58 of the ledges, prior to the latter being fully embedded the accumulated material The ledges 53 are arranged to extend further into the flow of material along the pathway 19 in the direction towards the discharge zone defined by the discharge section 17. Such an arrangement is facilitated by the sloping nature of the back wall 24, and also by appropriate sizing of the ledges 53 as represented by the width of the ledges, with the width of the ledges increase progressively in the downward direction of the pathway. This arrangement contributes to the progressive reduction in the cross-sectional flow area of the pathway 19.

The ledges 53 start at a location above the point at which the back wall 24 intercepts the incoming material flow issuing from the discharge conveyor belt and continue along the length of the pathway 19 where material flow can occur.

The ledges 53 are sized and spaced according to the material size and type for which the transfer chute is designed to handle. Typically, the ledges 53 are at spacings of about 150 to 200 mm and have a depth of about 200 mm. The ledges 53 can, of course, be of different configurations, sizes and spacings.

The ledges 53a accommodated within the chute transfer section 15 are all substantially of the same size and shape, apart from their length which progressively decreases to accommodate the tapering nature of the flow path 19 within the chute transfer section.

However, the ledges 53b accommodated within the discharge section 17 progressively increase in size (width) in the direction towards the discharge opening 41. With this arrangement, the cross-section flow area of the pathway 19 progressively contracts in the flow direction towards the discharge opening 41. The purpose of this arrangement is to further promote accumulation of material on the ledges 53b as well as build-up of accumulated material, and also control the rate of material flow to the discharge opening 41. Further this also facilities the centralized flow of material referred to above.

The lowermost ledge 53b is shown in FIG. 8 and the central edge section 58 thereof determines the location of the delivery point 18 of the discharge section 17. In FIG. 8 the direction of movement of the receiving belt conveyor 102 is depicted by arrow 105.

With this arrangement, the material flow is presented to the receiving belt conveyor 102 in a controlled and centralized matter. This serves to ensure that there is no material spillage and fugitive dust.

As previously mentioned, the rear wall structure 23 tapers to a width of about one-third of the width of the receiving belt 102a of the receiving belt conveyor 102. This is advantageous as it assists in preventing no material spillage and fugitive dust and also provides sufficient clearance from the belt edges to accommodate any likely belt tracking issues.

It is a feature of the embodiment that the accumulation of material within the transfer chute 10 establishes a flow arrangement in which accumulated and built-up material isolates those parts of the wall structure 21 likely to be vulnerable to wear by the aggressive nature of the material flow; such a flow arrangement constitutes ore-on-ore flow.

In the transfer chute 10 according to the embodiment, the central edge sections 58 of the ledges 53 provide a series of spaced locations which together describe the profile of the flow surface 40 prior to embedding of the ledges, as mentioned above. The angle of the flow surface presented by the ledges 53 is maintained in the chute body section 15 while the pathway 19 is narrowed in that section, thus consolidating the ore flow and increasing the bed depth of material on the upper portion 31 of the rear wall structure 23. The narrowing of the pathway 19 is gradual so as not to create flow turbulence as this will lead to uncontrolled flow.

Figure 10:
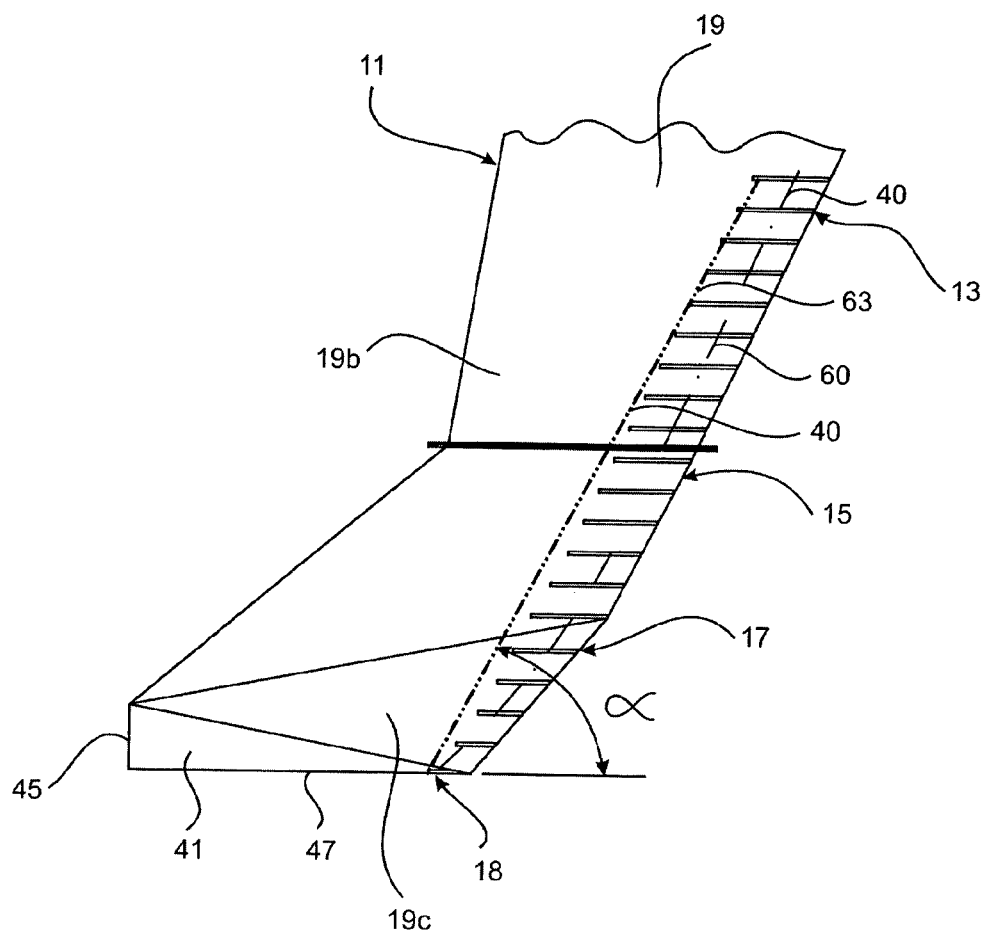
FIG. 10 is a fragmentary view of the arrangement shown in FIG. 9, with a further marking to show the angle of the flow surface.

The angle of the flow surface 40 presented by the ledges 53 is gradually changed along the lower portion 32 of the rear wall structure 23 disposed within the discharge section 17 such that the line drawn from the delivery point 18 of the discharge section 17 to the point of first contact within the transfer represents the worst case stall angle for the material being handled. This will create the necessary conditions for the ore to build-up, starting from the bottom or outlet of the transfer, up to the point of first contact creating an ore-on-ore flow surface 40 along which the ore will flow. This is depicted schematically in FIG. 9 in which the uppermost point of first contact of any incoming flow material entering from the entrance section 13 is identified by reference numeral 61. In FIG. 9, the line 63 depicting the developed flow surface 40 extends between the delivery point 18 and the point 61 of first contact creating an ore-on-ore flow surface 40 along which the ore will flow. This line 63 depicting the developed flow surface 40 is at an angle α to the horizontal, as shown in FIG. 10, which equates approximately to the adopted stall angle of material for which the transfer chute 10 is designed.

The lower portion 32 of the rear wall structure 23 disposed within the discharge section 17 is configured to gradually change in slope such that the exit angle at the delivery point 18 to the receiving belt conveyer 102 is usually well below the stall angle of the material concerned. In other words, the exit angle is selected such that the material would not normally flow at this angle, thereby decelerating the material flow along the pathway, as mentioned above. This exit angle however is dictated by the need to create an alignment from the exit point to the point of first contact within the transfer equivalent to the stall angle.

With this arrangement, the flow surface 40 is developed through slowing the material flow sufficiently by reducing the angle of the back wall 30 to below the stall angle of the material. The logic of creating such an alignment within the transfer chute 10 is that the stall angle represents the angle of natural balance for the ore in the dense granular flow regime and by creating such an alignment we ensure there is sufficient build-up to minimise wear while not allowing the ore to continue to build such that the transfer would then block or limit flow in some way. The height of the transfer chute and the stall angle of the material will dictate what the exit angle should be. The exit angle is usually adjusted by adjusting the exit angles of the last 5 to 15 ledges by 1 to 3 degrees each. Through this the slowing of material flow, ore creates build-up on the ledges 53 from the bottom and extending up to the initial intercept point 61 in a manner that creates a reasonably smooth surface of ore that approximates the stall angle, ultimately fully embedding those portions of the ledges that are within the pathway 19 of the ore flow within the transfer chute.

It is most desirable that the build-up be: (1) sufficient to cover all the areas within the transfer chute where material is likely to flow; and (2) not so deep at or near the initial point of contact at the entrance zone as to affect the way in which the material will flow within the transfer chute.

In order to achieve this, the design methodology involves drawing a line from the delivery point 18 and the point 61 of first contact that is close to or the same as the adopted stall angle of the most cohesive material being handled. This line then dictates the final exit angle from the transfer chute being designed. The ledge design is then configured as above, first allowing acceleration then gradually slowing by reducing the angles within the transfer to meet such an alignment.

In order to achieve the correct balance of build-up, it is desirable that the design be assessed using dynamic scale modelling. This allows the flow angles to be assessed based on various parameters and conditions to ensure the angles within the transfer will not create a blockage event. With this approach, a designer can refine the angles if necessary. Typically, the refinement may include minor adjustments to the angles lower down in the transfer chute. Further, an assessment may be made as to whether a secondary affect known as structural arching is a factor and if so adjusting the width at the bottom of the transfer chute by making it slightly wider.

The lower region 40b of the flow surface 40 is preferably designed to provide a slope at an angle of about 55 degrees to the horizontal at the delivery point although in some taller transfers exit angles down to 40 degrees are possible The ledges 53 are assembled in a manner that their surface alignment describes the flow pattern that has been selected for the transfer chute. At the exit point the final angle is sufficiently less than the stall angle as to cause the material to build-up and this build-up will continue until a new flow surface has been created that will approximate the flow angle of the ore. This final angle is selected by ensuring that from the point of initial contact 61 on the back wall 30 of the transfer chute to the delivery point 18 is in fact equivalent to the worst case stall angle for the ore being processed.

The particular ledges accommodated within the discharge zone defined by the discharge section 17 progressively increase in length in the direction towards the discharge opening 41 in the discharge zone. This is to accommodate the increased bed depth of material as the cross sectional area is reduced which in turn means material will start contacting the side walls so by extending the ledges we can retain ore in this area as well and therefore mitigate wear.

The design is such that once the build-up of accumulated material had been completed, the ledges in the flow area are preferably fully embedded in the accumulated material. There will be little or no build-up on the ledges outside the normal flow area. In this way, there will not be accumulation of material any more than is necessary to establish to flow surface. In particular, material will not accumulate to any extent which might create a blockage to flow along the pathway 19.

The design seeks to provide an arrangement in which the upper region 40a of the flow surface 40 is configured to allow the material flow to accelerate in order to maintain material speed and the lower region 40b configured to cause the material flow decelerate to facilitate the building up of material in the lower section of the transfer chute. Specifically, the upper region 40a is disposed at an angle to above the adopted stall angle of the flow material and the lower region 40b is configured to gradually change in slope such that the exit angle at the delivery point 18 is at or below the adopted stall angle of the material concerned, thereby decelerating the material flow along the pathway 19.

The transfer chute 10 is designed to achieve this "ore-on-ore" flow strategy and thereby extend its service life between maintenance shut downs. As mentioned above, transfer chutes in bulk materials handling systems contribute significantly to downtime and maintenance costs. Accordingly, any extension of the service life of a transfer chute is most desirable in terms of productivity of the bulk materials handling systems.

In transfer chute 10 according to the embodiment facilities a design approach according to the material type required to be handled and also the desired flow characteristics of the flowing stream of material along the pathway. In particular, the design approach is to ensure that production performance will not change with any changes in the material properties, provided that those property changes in the material were considered and accounted for in the design process.

There is a need to maintain a controlled flow of the material along the pathway 19. It has been found that material flow will not accelerate significantly if there is ore-on-ore flow and the angles upon which the stream of material is flowing is within 10 degrees of the adopted stall angle of the given material. The stall angle will vary with the moisture content of the given material. Having regard to these issues, and also to the requirement to maintain sufficient speed along the pathway 19 such that the transfer capacity of the transfer chute 10 at the discharge section 17 is in excess of the reception capacity of the receiving belt conveyor 102, the objective in the design approach is to create ore-on-ore flow through controlled flow of the material along the pathway. This is accomplished by gradually changing the slope of the lower portion 32 of the rear wall structure 23 such that the exit angle at the point of delivery to the receiving belt conveyor 102 is at or below the stall angle of the material concerned. The height of the transfer chute 10 and the physical properties of the material concerned will dictate the actual exit angle.

Typically, the gradual changing the slope of the lower portion 32 of the rear wall structure 23 is accomplished over the lowermost 5 to 15 ledges 53b within the discharge section 17 by variations of about 1 to 3 degrees of slope each. Usually, the higher the transfer chute 10 the greater the slowing of the flow material required and therefore the greater the required angle change. Conversely, more adhesive flow materials require smaller angle changes.

It is by virtue of the flow material slowing that accumulated material progressively builds-up from the bottom of the pathway 19 to the point of interception in incoming flow through the entrance zone at the entry section 13. The build-up of accumulated material is in a manner which creates a reasonably smooth flow surface 40 confronting the flow material for ore-on-ore flow along pathway 19. Once the build-up of accumulated material had been completed, the ledges 53 are fully embedded in the accumulated material and the accumulated material provides for "ore-on-ore" flow at the flow surface 40.

It is likely that different materials (such as different ores) being transferred through the same transfer chute 10 will build-up accumulated material differently. For example, lower moisture content, more free-flowing ores will likely build-up less, and adhesive or cohesive ores will likely build-up far more.

One reason ore builds-up more (involving creation of more material depth over the ledges 53) is due structural arching at the initial load point on the receiving belt conveyer 102. In some cases the build-up can be such as to distort the flow within the pathway 19 which can lead to chute choking. This can be controlled by adjusting the initial presentation width of material the receiving belt conveyor 102 and thereby manipulating the build-up depth for the more adhesive or cohesive ores without the need to modify the overall integrity of the chute design Structural arching can also occur if the ore being handled comprises largely of lump (larger size) ore and in such cases similar adjustments may need to be made to the way in which the ore is presented to the receiving belt conveyer 102.

In situations where there are large variations in ore types (inclusive of cohesive/adhesive ores) and therefore the exit angles from the transfer chute 10 onto the receiving belt conveyor 102 is possibly 55 to 60 degrees, the above presentation methodology and the design of the transfer chute will see most of the larger ore pieces flowing at the top of the ore stream. This means that finer ore will impact the receiving belt conveyor 102 first, creating a "cushion" affect. Further calculation of the velocity vectors show that at these angles, the vertical velocity component (and therefore impact energy contained) of the lump ore is relatively low and through this it is apparent that even in these extremes there is little likelihood of impact damage to the receiving belt.

If the overall height of the transfer chute 10 is limited because of the system geometry and therefore there are limited to the angles that can be used within the transfer chute, then it will be necessary to separately collect the fines material that comes off belt scrapers associated with the upper discharge belt conveyor and run them onto the lower receiving belt conveyor using a fines chute as this material will not flow effectively if the angles within the chute are not initially very high.

As the overall transfer chute design is based on very predictable flow, the transfer chute 10 can be designed and built incorporating flanged, bolted segments that make is very easy to assembly and therefore very easy to maintain by replacing the worn segments on as exchange basis.

The design of the embodiment transfer chute 10 which has been described and illustrated allows for fabrication using cut, flat plate without lip liners. While it is possible to do otherwise, this feature simplifies the fabrication and reduces fabrication costs. Using ledges in the embodiment transfer chute 10 facilitates the fabrication process. Without use of ledges, it would be necessary to incorporate gradual angle changes in plate material which can be difficult.

From the foregoing, it is evident that the transfer chute 10 according to the embodiment is so designed and constructed as to provide controlled build-up of accumulated material within the transfer chute such that material flow through the transfer is "ore-on-ore". More particularly, the flow pathway 19 comprises an upper section 19a for accommodating accelerating flow to maintain dense granular flow, an intermediate section 19b for consolidating flow in which the flow rate is retarded in a controlled manner avoiding creation of flow turbulence, and a lower section 19c for further retarding flow to create a controlled accumulation and build-up of material upwardly from the lower section.

With this arrangement, the upper section 19a of the flow pathway 19 allows material to accelerate to ensure all particles flow in the dense granular flow regime. There follows consolidation of the material flow in intermediate section 19b in a manner that does not create any flow turbulence, any flow disruption, any flow restriction that in any way might cause the material to accumulate or arbitrarily slow down, except in a controlled manner. Finally, the angles of surfaces presented to the material flow along the pathway 19, particularly on the back wall 24, are progressively changed in the lower section 19c such that the material flow discharges from the pathway 19 at an exit angle well below the stall angle; that is, the material discharges from the pathway 19 at an angle at which it would not normally flow. The lower section 19c serves to further retard flow after the intermediate section 19b to create a controlled accumulation and build-up of material upwardly from the lower section.

The invention can be applied generally to all types of transfer applications but was specifically developed to manage the complex ores that are encountered in many hard rock applications. For present purposes, complex ores are defined as those that have any or all of the following characteristics:
- (a) Material size variations such that there will be a separation of the particles within what is meant to be a homogenous mixture that will create flow variations that could impact on the performance of the conveyor system.
- (b) Variations in moisture content that will create flow variations that must be managed within the transfer chute in order to avoid build-up and blockages.
- (c) High volumes of micro fines (~200 micron material) or ultra fines (~20 micron) that could agglomerate with moisture and thus create cohesive or worse, adhesive mixtures that could create build-up or blockages within the transfer. Conversely these same particles could create dust issues in the absence of moisture.
- (d) Highly abrasive ores in general as they create maintenance issues that must be managed.
- (e) Ore that has lumps sizes greater that 150 mm.

Logically the most difficult ore types have all of these characteristics.

It should be appreciated that the scope of the invention is not limited to the scope of the embodiment described. In the embodiment described, the transfer chute 10 was designed on the basis of the worst case stall angle for the material concerned. This constituted the adopted stall angle and corresponded to the highest stall angle for the materials to be handled.

In another embodiment, the transfer chute may be designed on the basis of a deemed constant value when handling cohesive or adhesive ores. The constant value may be an angle of about 63 degrees.

While the present invention has been described in terms of a preferred embodiment in order to facilitate a better understanding of the invention, it should be appreciated that various modifications can be made without departing from the principles of the invention. Therefore, the invention should be understood to include all such modifications within its scope.

Reference to positional descriptions, such as "upper", "lower", "top" and "bottom", are to be taken in context of the embodiments depicted in the drawings, and are not to be taken as limiting the invention to the literal interpretation of the term but rather as would be understood by the skilled addressee.

Additionally, where the terms "system", "device", and "apparatus" are used in the context of the invention, they are to be understood as including reference to any group of functionally related or interacting, interrelated, interdependent or associated components or elements that may be located in proximity to, separate from, integrated with, or discrete from, each other.

Throughout this specification, unless the context requires otherwise, the word "comprise" or variations such as "comprises" or "comprising", will be understood to imply the inclusion of a stated integer or group of integers but not the exclusion of any other integer or group of integers.

The invention claimed is:

1. A transfer chute comprising: a wall structure and a flow pathway for material flow, wherein the wall structure defines the flow pathway, the flow pathway comprising:
   an upper section configured by the wall structure to accommodate accelerating flow to maintain a dense granular or continuous flow regime,
   an intermediate section configured by the wall structure to provide consolidated flow in which the flow rate is retarded in a controlled manner avoiding creation of flow turbulence, and
   a lower section configured by the wall structure to further retard flow to create a controlled accumulation and build-up of material upwardly from the lower section to the point at which material initially enters the flow pathway.

2. The transfer chute according to claim 1, wherein the intermediate section is configured by the wall structure to provide consolidated flow in which the flow rate is retarded in a controlled manner avoiding creation of flow turbulence, wherein effective friction between particles in the flow mass separates the particles by size into larger particles and smaller particles, and wherein the lower section configured by the wall structure to further retard flow such that the smaller particles in the flow mass decelerate to the point of stopping in order to create a controlled accumulation and build-up of material upwardly from the lower section towards the upper section.

3. A method of lining a transfer chute with lining material sourced from a material flow within the transfer chute, the method comprising:
   delivering material as a flow to an entrance zone of the transfer chute;
   providing a first wall structure of the transfer chute that intercepts incoming material flow through the entrance zone; and
   providing a pathway defined by the transfer chute for the material to flow between the entrance zone and a discharge zone, the pathway having a bottom end adjacent the discharge zone, the pathway creating a controlled accumulation and build-up of material from the bottom end thereof upwardly to the point at which material initially enters the pathway at the entrance zone to provide said lining material, whereby material flowing along the pathway impinges upon the accumulated material thereby affording resistance to wear on the transfer chute caused by the flow of material.

4. The method according to claim 3, wherein the controlled accumulation and build-up of material is created by the pathway having an adopted stall angle, said adopted stall angle is a notional angle from a horizontal plane to a surface bounding the pathway to effect a controlled accumulation and build-up of material upwardly from the lower section of the pathway.

5. The method according to claim 4, wherein the adopted stall angle is the highest angle for the materials being handled to maintain continuous flow through the transfer chute.

6. The method according to claim 4, wherein the adopted stall angle comprises a constant value.

7. The method according to claim 4, wherein the adopted stall angle comprises an angle in the range of about 60 to 65 degrees.

8. The method according to claim 7, wherein the adopted stall angle comprises an angle of about 63 degrees.

9. The method according to claim 4, wherein the controlled accumulation and build-up of material is created by configuring the first wall structure of the transfer chute with respect to the adopted stall angle of the flow material, whereby in use the build-up occurs upwardly from the bottom end of the pathway.

10. The method according to claim 9, wherein the pathway comprises an upper section, a lower section and an intermediate section between the upper and lower sections, and wherein at the initial contact point of material on the first wall structure within the upper section, the first wall structure is at an angle from a horizontal plane greater than the adopted stall angle.

11. The method according to claim 10, wherein the first wall structure has sections having one or more further angles from a horizontal plane downwardly along the intermediate section of the pathway and wherein the pathway is narrowed in a manner so as not to create flow turbulence.

12. The method according to claim 11, wherein the further angles of the first wall structure downwardly along the lower section of the pathway are gradually changed such that a notional line extending from a delivery point in the discharge zone of the transfer chute to the point of first contact within the transfer chute forms an angle from a horizontal plane equal to the adopted stall angle for the material being handled.

13. The method according to claim 12, wherein the lower section is configured to gradually change in slope such that the exit angle of the pathway from a horizontal plane at the point of delivery to a receiving belt conveyer is below the adopted stall angle.

14. The method according to claim 9, wherein the first wall structure and any material accumulated thereon provides a flow surface confronting the pathway.

15. The method according to claim 14, wherein the flow surface defines an upper region wherein the material flow accelerates in order to maintain material speed along the pathway and a lower region wherein the material flow decelerates to facilitate the building up of material in the lower section of the transfer chute.

16. The method according to claim 14, wherein the first wall structure and any material accumulated thereon together define the flow surface which forms the back of the transfer chute along which material flows.

17. The method according to claim 14, wherein the flow surface is so configured by configuring the angles of the first wall structure from a horizontal plane thereof, initially by allowing the material to accelerate by having the angles of the first wall structure greater than the adopted stall angle in order to maintain material speed along the pathway and then by the first wall structure having reduced angles lower in the transfer chute to below the adopted stall angle of the material to thereby slow the material flow.

18. The method according to claim 9, further comprising providing the first wall structure with a plurality of formations along the pathway adapted for the controlled accumulation and build-up of material upon which material flowing along the pathway impinges.

19. The method according to claim 18, further comprising providing the transfer chute with second and third wall structures disposed on opposed sides of the first wall structure, the first wall structure being sloped to progressively reduce the cross-sectional flow area of the pathway in the direction towards the discharge zone.

20. The method according to claim 19, wherein the formations extend from the first wall structure onto adjacent portions of the second and third wall structures.

21. The method according to claim 18, wherein the formations comprise ledges disposed at intervals along the pathway.

22. The method according to claim 21, wherein the ledges provide a series of spaced locations upon which material accumulates to form a flow surface confronting the pathway.

23. The method according to claim 21, wherein upon completion of build-up of accumulated material, the ledges are fully embedded in the accumulated material.

24. A transfer chute for use in performing the method according to claim 3.

25. A transfer chute comprising
an entrance zone through which a flow of material is received,
a discharge zone from which the flow of material is delivered, and
a pathway for material flow between the entrance and discharge zones, the pathway having a bottom end adjacent the discharge zone, the pathway being configured by a first wall structure of the transfer chute to create a controlled accumulation and build-up of material from the bottom end thereof upwardly to a point at which material initially enters the pathway at the entrance zone, whereby material flowing through the transfer chute impinges upon the accumulated material thereby affording resistance to wear caused by the flow of material.

26. The transfer chute according to claim 25, wherein the controlled accumulation and build-up of material is created by configuring the first wall structure with respect to an adopted stall angle of the flow material, and wherein said adopted stall angle is a notional angle of a surface bounding the pathway from a horizontal plane to effect a controlled accumulation and build-up of material upwardly from a lower section of the pathway, whereby in use the build-up occurs upwardly from the bottom end of the pathway.

27. The transfer chute according to claim 26, wherein the adopted stall angle is the highest angle for the materials being handled to maintain continuous flow through the transfer chute.

28. The transfer chute according to claim 26, wherein the adopted stall angle comprises a constant value.

29. The transfer chute according to claim 26, wherein the adopted stall angle comprises an angle in the range of about 60 to 65 degrees.

30. The transfer chute according to claim 29, wherein the adopted stall angle comprises an angle of about 63 degrees.

31. The transfer chute according to claim 26, wherein the flow pathway comprises an upper section, a lower section and an intermediate section between the upper and lower sections; and
wherein at the initial contact point of material on the first wall structure within the upper section, the first wall structure is at an angle from a horizontal plane greater that the adopted stall angle.

32. The transfer chute according to claim 31, wherein the first wall structure has sections having one or more angles from a horizontal plane downwardly along the intermediate section of the pathway and wherein the flow pathway is narrowed in a manner so as not to create flow turbulence.

33. The transfer chute according to claim 32, wherein the one or more angles of the first wall structure downwardly along the lower section of the pathway are gradually changed such that a notional line extending from a delivery point in the discharge zone to the point of first contact within the transfer chute forms an angle from a horizontal plane equal to the adopted stall angle for the material being handled.

34. The transfer chute according to claim 33, wherein the lower section is configured to gradually change in slope such that the exit angle of the pathway from a horizontal plane at the point of delivery to a receiving belt conveyer is below the adopted stall angle.

35. The transfer chute according to claim 26, wherein the first wall structure and any material accumulated thereon provides a flow surface confronting the pathway.

36. The transfer chute according to claim 35, wherein the flow surface defines an upper region wherein the material flow accelerates in order to maintain material speed along the pathway and a lower region wherein the material flow decelerates to facilitate the building up of material in the lower section of the transfer chute.

37. The transfer chute according to claim 35, wherein first wall structure and any material accumulated thereon together define the flow surface and wherein the flow surface forms the back of the transfer chute along which material flows.

38. The transfer chute according to claim 35, wherein the flow surface is so configured by configuring the angles of the first wall structure from a horizontal plane thereof, initially by allowing the material to accelerate by having the angles of the first wall structure greater than the adopted stall angle in order to maintain material speed along the pathway and then by the first wall structure having reduced angles lower in the transfer chute to below the adopted stall angle of the material to thereby slow the material flow.

39. The transfer chute according to claim 26, wherein the first wall structure further comprises a plurality of formations provided along the pathway adapted to establish the controlled accumulation and build-up of material upon which material flowing along the pathway impinges.

40. The transfer chute according to claim 39, further comprising second and third wall structures disposed on opposed sides of the first wall structure, the first wall structure being sloped to progressively reduce the cross-sectional flow area of the pathway in the direction towards the discharge zone, wherein the formations extend from the first wall structure onto adjacent portions of the second and third wall structures.

41. The transfer chute according to claim 40, wherein the formations extend from the first wall structure onto adjacent portions of the second and third wall structures.

42. The transfer chute according to claim 39, wherein the formations comprise ledges disposed at intervals along the pathway.

43. The transfer chute according to claim 42, wherein the ledges provide a series of spaced locations upon which material accumulates to form a flow surface confronting the pathway.

44. A method of transferring bulk materials between first and second locations by way of a transfer chute through which the material flows, the method comprising delivering a flow of the material from the first location to the transfer chute, causing the material flow to initially accelerate within the transfer chute in order to maintain material speed through the transfer chute and thereby consolidate the material flow within the transfer chute, and to then decelerate to facilitate the building-up of material in a lower section of the transfer chute, wherein the build-up extend upwardly within the transfer chute to a point at which the material initially enters the transfer chute, and discharging material flowing through the transfer chute at the second location.

45. A transfer chute comprising a flow pathway for material flow in a flow direction, wherein a first wall structure defines the flow pathway, the flow pathway comprising:

an upper section comprising a sloped region having a slope at an angle of about 65 to 75 degrees to the horizontal, thus being configured to accommodate accelerating flow to maintain a dense granular or continuous flow regime, an intermediate section downstream of the upper section in the flow direction and adjacent said upper section, said intermediate section configured to narrow the pathway along the flow direction to provide consolidated flow in which the flow rate is retarded in a controlled manner avoiding creation of flow turbulence, and a lower section downstream of the intermediate section in the flow direction and adjacent said intermediate section, said lower section comprising a slope at an angle of about 40 to about 55 degrees to the horizontal, thus being configured to further retard material flow to create a controlled accumulation and build-up of material upwardly from the lower section towards the upper section;

wherein the first wall structure in each of the upper, intermediate and lower sections comprises a plurality of formations along the pathway adapted for the controlled accumulation and build-up of material upon which material flowing along the pathway impinges.

46. The transfer chute according to claim 45, wherein the ledges associated with the lower section of the first wall structure progressively increase in length along the flow direction of the pathway.

* * * * *